(12) United States Patent
Okabe et al.

(10) Patent No.: US 6,554,420 B2
(45) Date of Patent: Apr. 29, 2003

(54) COLOR FILTER AND PROCESS FOR PRODUCING THE SAME

(75) Inventors: Masato Okabe, Tokyo-to (JP); Hironori Kobayashi, Tokyo-to (JP); Manabu Yamamoto, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 10/142,379

(22) Filed: May 9, 2002

(65) Prior Publication Data

US 2002/0126194 A1 Sep. 12, 2002

Related U.S. Application Data

(62) Division of application No. 09/453,063, filed on Dec. 6, 1999, now Pat. No. 6,450,635.

(30) Foreign Application Priority Data

Dec. 9, 1998 (JP) .......................... 10-350431
Jan. 7, 1999 (JP) .......................... 11-002167
Jun. 28, 1999 (JP) .......................... 11-182297
Oct. 1, 1999 (JP) .......................... 11-281519

(51) Int. Cl.[7] .................................. B41J 3/407
(52) U.S. Cl. ...................................... 347/106
(58) Field of Search .................. 347/106, 105, 347/53, 1, 102, 100, 101; 106/287.16, 31.58, 31.86; 313/506; 428/195

(56) References Cited

U.S. PATENT DOCUMENTS 5,589,732 A 12/1996 Okibayashi et al. ........ 313/506
5,755,867 A 5/1998 Chikuni et al. ........ 106/287.16

FOREIGN PATENT DOCUMENTS

| EP | 0718644 | 6/1996 |
|---|---|---|
| EP | 0932081 | 7/1999 |
| JP | 59075205 | 4/1984 |
| JP | 7234314 | 9/1995 |
| JP | 08227012 | 9/1996 |
| JP | 08230314 | 9/1996 |
| JP | 9049913 | 2/1997 |
| JP | 9131914 | 5/1997 |
| JP | 9178929 | 7/1997 |
| JP | 09203803 | 8/1997 |
| JP | 9314052 | 12/1997 |
| JP | 10133631 | 5/1998 |
| JP | 11147360 | 2/1999 |
| JP | 11078271 | 3/1999 |
| JP | 11208134 | 3/1999 |
| JP | 11105234 | 4/1999 |
| JP | 11109610 | 4/1999 |
| JP | 11115334 | 4/1999 |
| JP | 11115335 | 4/1999 |
| JP | 11133631 | 5/1999 |
| JP | 11138970 | 5/1999 |
| JP | 11138971 | 5/1999 |
| JP | 11143055 | 5/1999 |
| JP | 1191255 | 6/1999 |
| JP | 11245533 | 9/1999 |
| JP | 11249287 | 9/1999 |
| JP | 11258860 | 9/1999 |
| JP | 11123804 | 11/1999 |
| JP | 11123805 | 11/1999 |
| JP | 11123806 | 11/1999 |
| JP | 11123807 | 11/1999 |
| JP | 1138226 | 12/1999 |
| WO | 9629375 | 9/1996 |

Primary Examiner—Lamson Nguyen
Assistant Examiner—K. Feggins
(74) Attorney, Agent, or Firm—Ladas & Parry

(57) ABSTRACT

There is provided a color filter which comprises a transparent substrate, a picture element part provided on the transparent substrate by the predetermined pattern of a plurality of colors with an ink jet system, a shading part provided on a border part of this picture element part, and a wettability-variable layer, in which the wettability can be changed, provided for forming the picture element part or the picture element part and the shading part.

17 Claims, 9 Drawing Sheets

COLOR FILTER AND PROCESS FOR PRODUCING THE SAME

This application is a division of U.S. Ser. No. 09/453,063 Entitled "Color Filter And Process for Producing the Same" filed Dec. 6, 1999 now U.S. Pat. No. 6,450,635, which U.S. application is hereby incorporated herein by reference.

BACKGROUND OF THE INVENTION

The present invention relates to a color filter which is obtained by coloring a picture element part with an ink jet system and which is suitable for a color liquid crystal display and a process for producing the same.

Recently, there has been a tendency that a demand for a liquid crystal display, particularly a color liquid crystal display is increasing with the development of a personal computer, particularly a portable personal computer. However, since this color liquid crystal display is expensive, a demand for the cost-cut is getting higher and, in particular, a demand for the cost-cut of a color filter weighing in a respect of cost is high.

In such a color filter, a liquid crystal usually operates as a shutter by equipping with three primary colors of red (R), green (G) and blue (B) and switching ON and OFF of an electrode corresponding to each picture element part of R, G and B and the color display is performed by transmission of the light through each picture element part of R, G and B.

As a process for producing a color filter which has hitherto been carried out, there is, for example, a dyeing process. In this dyeing process, a water-soluble polymer material which is a material for dyeing is first formed on a glass substrate, which is patterned into the desired shape by a photolithography step and the resulting pattern is dipped into a dyeing bath to obtain a colored pattern. This is repeated three times to form a color filter layer consisting of picture element parts of R, G and B.

Alternatively, as an another method, there is a pigment dispersing method (color resist method). In this method, a photosensitive resin layer in which a pigment is dispersed is first formed on a substrate and this is subjected to patterning to obtain a monocolor pattern. Further, this step is repeated three times to form a color filter layer consist of picture element parts of R, G and B.

As a still another method, there are an electrode position method and a method of dispersing a pigment in a thermosetting resin and performing three times printing of R, G and B and, thereafter, thermally curing the resin. However, in any method, the same step needs to be repeated three times for coloring three colors of R, G and B, and there is a problem that the cost is high and a yield is decreased because of repetition of a step.

As a process for producing a color filter which has solved these problems, there is proposed a method of blowing a coloring ink with an ink jet system to form a colored layer (picture element part) (JP-A-59-75205). In the publication, there are disclosed a method in which a convex part which is a border is printed in advance with a material having the worse wettability on an ink when an ink having the better wettability on a glass substrate is used, and a method in which a pattern is formed in advance with a material having the better wettability on an ink to help the ink fixation when an ink having the worse wettability on a glass is used. However, there is no description regarding how to specifically coat a material having the better wettability and a material having the worse wettability.

On the other hand, as another process for producing a color filter by blowing a coloring ink by an ink jet system to form a colored layer (picture element part), there is disclosed a method of treating a concave part with an inkphilic treating agent in JP-A-9-203803. In this method, a convex part is formed in advance on a substrate and this convex part is made to be ink-repellent and, thereafter, the whole substrate is surface-treated with the inkphilic treating agent. However, in this method, since a convex part needs to be ink-repellent in advance upon the inkphilic treatment, there is a problem that two times treatments of the ink-repulsion treatment and the inkphilic treatment need to be performed.

In addition, as a method for producing a color filter by forming a colored layer with an ink jet system, there is described a method of forming a colored layer (picture element part) by providing an ink absorbing layer on a substrate and making a difference in the ink absorbability of this absorbing layer between an exposed part and an unexposed part in JP-A-8-230314 and JP-A-8-227012. However, in this method, since a colored layer is formed by forming an absorbing layer and absorbing an ink in this absorbing layer, there is a problem that a difference in the coloration between a central part of an ink dot and a surrounding part of that is present which results in the color nonuniformity. In addition, there is also a problem that this absorbing layer needs the predetermined thickness resulted from its function of absorbing an ink.

The present invention was done in view of the above problems and a main object thereof is to provide a color filter in which a part having the better wettability and a part having the worse wettability can be formed on a single layer regarding the wettability of a substrate which becomes problematic upon formation of a picture element part with an ink jet system, and a pattern formed of the part having the better wettability and the part having the worse wettability can be formed in a few steps and, further, an ink absorbing layer is not necessary, and which has the better quality and which can be produced with the low cost, and a process for producing the same.

SUMMARY OF THE INVENTION

In order to attain the aforementioned object, the present invention provides a color filter which comprises a transparent substrate, a picture element part in which a plurality of colors are provided in the predetermined pattern with an ink jet system on the transparent substrate, a shading part provided on a border part of the picture element part, and a wettability-variable layer being capable of varying the wettability which is provided for forming the picture element part, or the picture element part and the shading part.

As described above, the present invention is characterized in that it has a wettability-variable layer in order to form a picture element part, or a picture element part and a shading part. Therefore, by utilizing the change in the wettability of a wettability-variable layer, a picture element part, or a picture element part and a shading part can be formed with the better precision, and a high quality color filter having no problem such as color missing and color nonuniformity can be provided.

In this case, the construction may be such that at least the picture element part is provided on the wettability-variable layer. By forming a picture element part on the wettability-variable layer like this, a wettability-variable layer of a part on which a picture element part is formed can be made to be an inkphilic region having a small contact angle with a liquid. By coloring a picture element part forming portion which is an inkphilic region with an ink jet system, an ink is adhered to only the picture element part forming portion which is an inkphilic region having a small contact angle with a liquid, and further an ink is applied uniformly within the picture element part forming portion which is an inkphilic region. Therefore, a color having no disadvantage such as color nonuniformity and color missing can be provided.

In the present invention, when at least the picture element part is provided on a wettability-variable layer, the following three kinds of constructions can be adopted. First is the construction in which the shading part is provided on the transparent substrate, the wettability-variable layer is provided on this shading part and a picture element part forming portion on which the picture element part on the transparent substrate is provided, and further, the picture element part is formed on this wettability-variable layer (a color filter, in which a picture element part is formed on a wettability-variable layer and a wettability-variable layer is provided on a shading part, is referred to as the first embodiment hereinafter). Second is the construction in which a wettability-variable layer is formed on the transparent substrate and a picture element part and a shading part are provided on the predetermined position of this wettability-variable layer (a color filter, in which a picture element part and a shading part are provided on a wettability-variable layer, is referred to as the second embodiment hereinafter). Third is the construction in which the shading part is provided on the transparent substrate, a wettability-variable layer is provided on a picture element part forming portion on which a picture element part on the transparent substrate is formed, and a picture element part is formed on this wettability-variable layer (a color filter, in which a picture element part is formed on a wettability-variable layer and a wettability-variable layer is not formed on a shading part, is referred to as the third embodiment hereinafter).

In the aforementioned first embodiment, it is preferable that the width of the picture element part provided on the wettability-variable layer is wider than the width of an opening formed by the shading part. This is because, by forming the width of the picture element part so as to be wider than the width of an opening of a shading part like this, the disadvantages such as color missing that a backlight passes through a part on which a picture element part is not formed, can be prevented.

In the present invention, it is preferable that an ink-repellent convex part is formed on a surface of a wettability-variable layer provided on the shading part. Since by forming an ink-repellent convex part on the surface of a wettability-variable layer provided on a shading part like this, an ink-repellent convex part is formed between the picture element part forming portions upon forming the picture element part by making a wettability-variable layer of a picture element part forming portion into an inkphilic region, the disadvantages such as mixing of inks do not occur, being preferable.

In this case, it is preferable that the width of the ink-repellent convex part is narrower than that of the shading part. This is because by forming the width of an ink-repellent convex part narrower than that of a shading part like this, the width of a picture element part formed between the ink-repellent convex parts can be formed wider than the width of an opening formed by a shading part and, thus, the aforementioned effects can be obtained.

On the other hand, in a color filter of the present invention, the construction may be such that the wettability-variable layer is provided on a border part of the picture element part. By making the wettability of a wettability-variable layer on a border part of a picture element part, an ink-repellent region having the larger contact angle with a liquid than that of a part on a transparent substrate on which a picture element part is formed like this, since it is difficult for an ink to migrate over a border part of a picture element part having the ink-repellent properties upon coloring a part on which a picture element part is provided (picture element part forming portion) with an ink jet system, a color filter having no disadvantages such as ink mixing and the like can be provided. In addition, by making a wettability-variable layer of a border part of a picture element part an inkphilic region having the small contact angle with a liquid thereafter, providing of the shading part on the border part of the picture element part or covering the whole with a protecting layer can be easily carried out and, thus, a color filter having the high quality can be obtained.

In this case, there are two preferable constructions. One of these is the construction in which the shading part is formed on the transparent substrate, a wettability-variable layer is formed on this shading part and the picture element part is formed between the wettability-variable layers (a color filter, in which a wettability-variable layer is provided on a shading part, is referred to as the fourth embodiment hereinafter). Another one is the construction in which the wettability-variable layer is formed on a shading part forming portion which is a part on which a shading part on the transparent substrate is formed, the shading part is formed on the wettability-variable layer, and a picture element part is formed between the shading parts (a color filter, in which a shading part is formed on a wettability-variable layer, is referred to as the fifth embodiment hereinafter).

In the fourth embodiment, it is preferable that the width of the wettability-variable layer is formed narrower than that of a shading. By making the width of a wettability-variable layer narrower than that of a shading part, the width of a picture element part formed between wettability-variable layers can be formed larger than that of an opening of a shading part. This is because, thereby, the disadvantages such as color missing and the like can be prevented.

In the aforementioned third embodiment and a color filter described above, in which the wettability-variable layer is provided on a border part of the picture element part, it is preferable that the wettability on the transparent substrate is less than 10 degrees in terms of the contact angle with a liquid having the surface tension of 40 mN/m. This is because, in the aforementioned third embodiment, an ink for a shading part is spread uniformly within a shading part forming portion and it becomes possible to form a uniform shading part with the better precision and, additionally, in the case of a color filter in which a wettability-variable layer is provided on a border part of the picture element part, since an ink for the picture element part is uniformly spread with a picture element part forming portion on a transparent substrate, the better-quality color filter having no disadvantages such as color nonuniformity and the like can be provided.

In the present invention, it is preferable that the wettability-variable layer is a photocatalyst-containing layer comprising at least a photocatalyst and a binder, and having the wettability which varies so that the contact angle with a liquid is decreased by irradiation with the energy. Like this, by forming a photocatalyst-containing layer having the wettability which varies so that the contact angle with a liquid is decreased by irradiation with the energy, the wettability of this layer can be varied by performing the pattern irradiation of the energy and the like and an inkphilic region having the small contact angle with a liquid can be formed easily and, for example, it becomes possible to easily make only a part on which a picture element part is formed into an inkphilic region. This is because, therefore, a color filter can be manufactured effectively and it becomes advantageous in a respect of cost.

In a color filter described above, it is preferable that the photocatalyst-containing layer contains fluorine and the photocatalyst-containing layer is formed so that the content of fluorine on the surface of the photocatalyst-containing layer is decreased by the action of the photocatalyst as compared with before the irradiation of the energy upon irradiating the photocatalyst-containing layer with the energy.

As mentioned above, since a color filter of the present invention is constructed such that the fluorine content of the energy irradiated part on a photocatalyst-containing layer formed on a transparent substrate is decreased, a pattern comprising a part in which the fluorine content is decreased can be formed by the pattern-irradiation of the energy. Since when the fluorine content is decreased, the part becomes a region having the high inkphilicity as compared with other parts, it becomes possible to easily make only a part on which a picture element part and the like is formed an inkphilic region, and a color filter can be easily manufactured.

Further, in a color filter described above, it is preferable that the fluorine content of a part in which the fluorine content is decreased by irradiating the photocatalyst-containing layer with the energy, is 10 or less relative to 100 of the fluorine content of a part which was not irradiated with the energy.

When, like this, the fluorine content of a part having the lower fluorine content which was formed by irradiating the photocatalyst-containing layer with the energy, is 10 or less based on the weight relative to 100 of the fluorine content of a part which is not irradiated with the energy, a great difference in the inkphilicity between a part irradiated with the energy and a part not irradiated with the energy can be produced. Therefore, by forming a picture element part and the like on a photocatalyst-containing layer on which such the pattern is formed, it becomes possible to precisely form a picture element part and the like on only an inkphilic region having the reduced fluorine content and a color filter can be manufactured with the better precision.

In the case that a photocatalyst-containing layer used in the present invention comprises at least a photocatalyst and a binder as described above, it is preferable that the photocatalyst is one or more selected from the group consisting of titanium oxide ($TiO_2$), zinc oxide (ZnO), tin oxide ($SnO_2$), strontium titanate ($SrTiO_3$), tungsten oxide ($WO_3$), bismuth oxide ($Bi_2O_3$), and iron oxide ($Fe_2O_3$). Inter alia, titanium oxide ($TiO_2$) is preferable. This is because since titanium oxide has the high band gap energy, it is effective as a photocatalyst, is chemically stable, has no toxicity and is easily available.

In the case of a color filter in which a photocatalyst is titanium oxide, it is preferable that it has a photocatalyst-containing layer in which fluorine element is contained in the surface of the photocatalyst-containing layer at an amount of 500 or more relative to 100 of titanium element as quantified by a X-ray photoelectron spectroscopic method.

This is because, when such the degree of fluorine (F) element is contained, the ink-repellent properties of a part not irradiated with the energy are sufficient and, when a pattern of a part having the reduced fluorine (F) element content by the energy irradiation is formed and a picture element part and the like are formed thereon, an ink and the like do not drop out into a part other than a part on which a picture element part is formed and a color filter can be manufactured more precisely.

On the other hand, in a color filter described above, a binder which is the other component constituting a photocatalyst-containing layer is preferably organopolysiloxane having a fluoroalkyl group.

The reasons are as follows. In a color filter of the present invention, as a method of inclusion of fluorine element in a photocatalyst-containing layer, mention may be made of various methods. However, by using organopolysiloxane having a fluoroalkyl group as a binder, fluorine element can be easily contained in a photocatalyst-containing layer and the content thereof can be easily reduced by the energy irradiation.

In addition, in a color filter described above, it is preferable that a binder which is the other component constituting a photocatalyst-containing layer, is formed of organopolysiloxane which is one or more of a hydrolyzed condensed compound or a co-hydrolyzed condensed compound of a silicon compound represented by $Y_nSiX_{(4-n)}$ (wherein Y represents alkyl group, fluoroalkyl group, vinyl group, amino group, phenyl group or epoxy group, X represents alkoxy group or halogen, and n is an integer of 0 to 3).

In a color filter described above, it is preferable that a silicon compound having a fluoroalkyl group among the aforementioned silicon compounds constituting the aforementioned organopolysiloxane is contained at an amount of not less than 0.01 mol %.

The reasons are as follows. When a silicon compound having a fluoroalkyl group is contained at an amount of not less than 0.01 mol %, fluorine element is sufficiently contained in the surface of a photocatalyst-containing layer and it is possible to make larger the difference in the wettability between an inkphilic region on a photocatalyst-containing layer having the reduced fluorine element content resulted from the energy irradiation and an ink-repellent region on the surface of a photocatalyst-containing layer not irradiated with the energy. Accordingly, an ink and the like can be precisely attached into an ink-repellent region without dropping out upon formation of a picture element part and the like on an inkphilic region, and a color filter having the better quality can be manufactured.

In the present invention, it is preferable that the contact angle with a liquid having the surface tension of 40 mN/m on the photocatalyst-containing layer is 10 degrees or more in a part not irradiated with the energy and the angle is less than 10 degrees in a part irradiated with the energy. Since a part not irradiated with the energy is a part requiring the ink-repellent properties, when the contact angle with a liquid having the surface tension of 40 mN/m is less than 10 degrees, the ink-repellent properties are not sufficient and there is a possibility that an ink and a coating material for a shading part and the like remain, being not preferable. On the other hand, when the contact angle of a part irradiated with the energy with a liquid having the surface tension of 40 mN/m is 10 degrees or more, there is a possibility that the spread of an ink and a coating material for a shading part is inferior, color missing and the like may occur in a picture element part.

Further, in the present invention, it is preferable that a picture element part colored with the aforementioned ink jet system is a picture element part colored with an ink jet system using an UV-curing ink. This is because, after a picture element part is colored with an ink jet system by using an-UV curing ink, UV is irradiated and, thereby, an ink can be rapidly cured, which can be sent to a next step, being preferable in a respect of the efficiency.

A liquid crystal panel having the aforementioned color filter and a substrate opposite thereto and which is obtained by encapsulating a liquid crystal compound between both substrates, has the advantages of the aforementioned color filter, that is, the advantages that color missing and color nonuniformity of a picture element part are not present and it is advantageous in a respect of cost.

In the present invention, in order to attain the aforementioned object, there is provided a process for producing a color filter, which comprises steps: (1) a step of forming a shading part on a transparent substrate, (2) a step of providing a photocatalyst-containing layer in which the wettability of a part irradiated with the energy is changed in a direction of the reduction of the contact angle of a liquid, on a surface of the transparent substrate on which a shading part was formed, (3) a step of forming an exposed part for a picture element part by irradiating with the energy a picture element part forming portion which is a part on this photocatalyst-containing layer on which a picture element part is formed, and (4) a step of coloring this exposed part for a picture element part with an ink jet system, to form a picture element part (which is referred to as the sixth embodiment hereinafter).

In this embodiment, only a part on which a picture element part is formed can be easily made inkphilic by providing a photocatalyst-containing layer on a transparent substrate on which a shading part is pre-formed and pattern-irradiating a picture element part forming portion with the energy on this photocatalyst-containing layer. Therefore, a picture element part with an ink uniformly adhered thereto can be obtained by adhering an ink to an exposed part for a picture element part on which this picture element part is to be formed with an ink jet system and a color filter having neither color nonuniformity nor color missing can be formed.

In the case of the aforementioned sixth embodiment, the embodiment may have a step of forming an exposed part for an ink-repellent convex part by pattern-irradiating a photocatalyst-containing layer on a shading part with the energy and, whereby, an ink-repellent convex part is formed thereon after a step of provision of the photocatalyst-containing layer.

Since an exposed part for an ink-repellent convex part is provided also on a photocatalyst-containing layer on a shading part by the pattern irradiation of the energy, an exposed part for an ink-repellent convex part having the predetermined width can be formed. Therefore, the ink-repellent convex part having the predetermined width can be obtained at a uniform height by applying a coating material for an ink-repellent convex part on this region.

Further, in the sixth embodiment of the present invention, an exposed part for a picture element part may be formed by exposing from the transparent substrate side using the shading part as a mask in a step of forming the aforementioned exposed part for a picture element part. By whole surface-exposing from the transparent substrate side, that is, a side on which a shading part is not formed, only a photocatalyst-containing layer corresponding to a part formed on the upper side of a shading part is not exposed and the other part can be exposed. Therefore, since the energy pattern irradiation can be performed without using a photomask and the like, it is advantageous in a respect of cost.

In addition, the present invention provides a process for production of a color filter, which comprises steps: (1) a step of providing a photocatalyst-containing layer having the wettability of the energy-irradiated part which changes in a direction of reduction of the contact angle with a liquid, on a transparent substrate, (2) a step of forming an exposed part for a shading part on a shading part forming portion on the transparent substrate on which a shading part is to be formed by pattern-irradiating with the energy, (3) a step of providing a shading part on this exposed part for a shading part, (4) a step of forming an exposed part for a picture element part on a transparent substrate on which this shading part is formed by the energy irradiation, and (5) a step of coloring this exposed part for a picture element part with an ink jet system, to form a picture element part (hereinafter referred to as the seventh embodiment).

In a process for producing a color filter in this embodiment, by providing a photocatalyst-containing layer on a transparent substrate and irradiating this photocatalyst-containing layer with the energy, the contact angle with a liquid of an exposed part can be reduced. Therefore, only a region forming a shading part can be first made to be an inkphilic region by simply pattern-irradiating a photocatalyst-containing layer with the energy upon formation of a shading part and, then, a shading part can be formed by applying a coating material for a shading part on this part. Therefore, since a developing step and an etching step after pattern-exposure which have been previously performed upon provision of a shading part need not to be performed. Accordingly, a shading part can be formed effectively. In addition, thereafter, a region forming a picture element part can be easily made to be an inkphilic region, for example, by irradiating the whole surface with the energy. Therefore, when the region is colored with an ink jet system, a picture element part with an ink uniformly adhered thereto can be obtained and a color filter having neither color missing nor color nonuniformity can be formed.

In addition, the present invention provides a process for producing a color filter, which comprises steps: (1) a step of providing a photocatalyst-containing layer having the wettability of the energy-irradiated part which changes in a direction of reduction of the contact angle with a liquid, on a transparent substrate, (2) a step of forming an exposed part for a picture element part on a picture element part forming portion which is a part on the transparent substrate, on which a picture element part is to be formed by pattern-irradiating with the energy, (3) a step of coloring this exposed part for a picture element part with an ink jet system, to form a picture element part, (4) a step of irradiating a photocatalyst-containing layer on at least a border part of the picture element part with the energy, and (5) a step of forming a shading part on the border part of a picture element part irradiated with the energy (hereinafter referred to as the eighth embodiment).

In this case, a photocatalyst-containing layer is formed on a picture element part forming portion which is a part on a transparent substrate on which at least a picture element part is to be formed, and on a shading part forming portion which is a part on which a shading part is to be formed. And a picture element part forming portion of this photocatalyst-containing layer can be first made to be an inkphilic region by pattern-irradiating the picture element part forming portion with the energy. Therefore, by adhering an ink thereto with an ink jet system, an ink is uniformly spread and color nonuniformity and the like do not occur. In addition, a shading part forming portion which is a border part between the picture element parts is not irradiated with the energy and, thus, it remains an ink-repellent region. Therefore, it can be said that it is difficult for an ink adhered to a picture element part forming portion which is an inkphilic region to migrate over a shading part forming portion which is an ink-repellent region. Accordingly, a problem such as the ink mixing does not occur. By irradiating a shading part forming portion between the picture element parts after a picture element part is formed, this part can be made into an inkphilic region. Therefore, by applying this part, for example, with an ink for a shading part, a shading part can be easily formed.

Further, the present invention provides a process for producing color filter, which comprises steps: (1) a step of providing a photocatalyst-containing layer having the wettability of the energy-irradiated part which changes in a direction of reduction of the contact angle with a liquid on a transparent substrate, on a picture element part forming portion on the transparent substrate which is a part on which a picture element part is to be formed, (2) a step of providing a shading part on a border part of the picture element part forming portion on which the photocatalyst-containing layer is provided, (3) a step of forming an exposed part for a picture element part by irradiating the photocatalyst-containing layer with the energy, and (4) a step of coloring this exposed part for a picture element part with an ink jet system to form a picture element part (hereinafter referred to as the ninth embodiment).

In this case, a photocatalyst-containing layer is first formed on a picture element part forming portion which is a part on a transparent substrate on which a picture element part is to be formed. When a material having the higher contact angle with a liquid than the transparent substrate surface in the state before the energy irradiation, is used in this photocatalyst-containing layer, a shading part forming portion on a substrate between the picture element part forming portions becomes an inkphilic region having the smaller contact angle with a liquid rather than a picture element part forming portion on which this photocatalyst-containing layer is formed. For example, by forming a shading part on this inkphilic region with a coating material for a shading part, a shading part can be first formed easily. Then, for example, by irradiating the whole surface on which this shading part is formed with the energy, a picture element part forming portion can be made into an inkphilic region. Therefore, by coloring this region with an ink jet system, a picture element part with an ink uniformly adhered thereto is obtained and a color filter having neither color missing nor color nonuniformity can be formed.

In addition, in the present invention, there is provided a process for producing a color filter, which comprises steps: (1) a step of forming a shading part on a transparent substrate, (2) a step of providing a photocatalyst-containing layer having the wettability of the energy-irradiated part which changes in a direction of reduction of the contact angle with a liquid on this shading part, and (3) a step of coloring with an ink jet system a picture element part forming portion which is a part on a transparent substrate with no photocatalyst-containing layer provided on which a picture element part is to be formed, to form a picture element part (hereinafter referred to as the tenth embodiment).

In this case, a shading part is first formed on a transparent substrate and a photocatalyst-containing layer is formed thereon. When a material having the higher contact angle with a liquid than the transparent substrate surface at the state before the energy irradiation is used in this photocatalyst-containing layer, a picture element part forming portion between photocatalyst-containing layers becomes an inkphilic region having the smaller contact angle with a liquid rather than this photocatalyst-containing layer and a photocatalyst-containing layer which is a border part of a picture element part forming portion is made into an ink-repellent region. Therefore, when an ink is adhered to a picture element part forming portion which is an inkphilic region with an ink jet system, it is difficult for an adhered ink to migrate over a shading part forming portion which is an ink-repellent region. Hence, a problem such as the ink mixing hardly occurs.

Further, in the present invention, there is provided a process for producing a color filter, which comprises steps: (1) a step of providing a photocatalyst-containing layer having the wettability of the energy-irradiated part which changes in a direction of reduction of the contact angle with a liquid on a transparent substrate, on a shading part forming portion which is a part on a transparent substrate on which a shading part is to be formed, (2) a step of coloring with an ink jet system a part on the transparent substrate on which a photocatalyst-containing layer is not formed to form a picture element part, (3) a step of irradiating at least the photocatalyst-containing layer with the energy, and (4) a step of forming a shading part on the photocatalyst-containing layer irradiated with the energy (hereinafter referred to as the eleventh embodiment).

In this case, a photocatalyst-containing layer is provided on a shading part forming portion on a transparent substrate on which a shading part is to be formed. When a material having the higher contact angle with a liquid in the state before the energy irradiation than the transparent substrate surface is used in this photocatalyst-containing layer, a picture element part forming portion between shading part forming portions becomes into an inkphilic region having the smaller contact angle with a liquid rather than a shading part forming portion on which this photocatalyst-containing layer is formed, and a shading part forming portion which is a border part between the picture element part forming portions becomes into an ink-repellent region. Therefore, when an ink is adhered with an ink jet system to a picture element part forming portion which is an inkphilic region, an adhered ink does not migrate over a shading part forming portion which is an ink-repellent region. Hence, a problem such as the ink mixing does not occur. After a picture element part is formed in such as way, by irradiating a photocatalyst-containing layer of a shading part forming portion between picture element parts with the energy, this part can be converted into an inkphilic region. Therefore, for example, by applying this part with an ink for a shading part, a shading part can be formed easily.

Further, in addition, in the aforementioned sixth embodiment and eight embodiment, a step of forming the exposed part for a picture element part and, thereafter, forming a picture element part by coloring the part with an ink jet system may comprise (a) a step of forming an exposed part for the first picture element part by pattern-irradiating a portion of a part on the photocatalyst-containing layer on which a picture element part is to be formed with the energy, (b) a step of coloring the exposed part for the first picture element part with an ink jet system to form the first picture element part, (c) a step of exposing a part forming the remainder picture element part on the photocatalyst-containing layer to form an exposed part for the second picture element part, and (d) a step of coloring this exposed part for the second picture element part with an ink jet system to form the second picture element part.

That is, in any embodiment, a picture element part is formed by forming an exposed part for a picture element part and coloring this part with an ink jet system. And upon formation of the picture element part, picture element parts are divided into the first picture element part and the second picture element part, which are colored with the energy irradiation and an ink jet system, respectively.

When a picture element part is formed by coloring with an ink jet system an exposed part for a picture element part which was converted into an inkphilic region by the energy irradiation, if the distance between the exposed parts for a picture element part is narrow, there may occur a possibility that inks of neighboring picture element parts are mixed over an ink-repellent region between picture element parts upon formation of a picture element part. Therefore, it is desirable that picture element parts are formed in the mutually isolated state upon formation of a picture element part. As described above, when a method of first forming the first picture element part and, thereafter, forming the second picture element part is adopted, for example, the pattern exposure can be performed so that picture element parts are formed alternately upon preparing the first picture element part and the neighboring picture element parts can be in the mutually isolated state upon the first time formation of a picture element part. By forming an exposed part for the first picture element part in the state where a relatively wide ink-repellent region is retained between regions to be colored, which is colored with an ink jet system, a possibility is eliminated that the disadvantages that inks of the neighboring picture element parts are mixed, occur. By irradiating again between the first picture element parts thus provided with the energy to form an exposed part for the second picture element part, which is colored with an ink jet system, a color filter can be formed which has no disadvantages such as the ink mixing and the like.

In addition, in the sixth embodiment and the tenth embodiment of the present invention, it is preferable that the width of the picture element part is formed wider than that of an opening formed by the shading part. This is because, by making the width of a picture element part wider than that of an opening formed by a shading part like this, a possibility that the backlight passes through parts other than picture element parts can be made smaller and color missing and the like can be prevented.

Further, in the ninth embodiment, the tenth embodiment and the eleventh embodiment of the present invention, it is preferable that the wettability on the transparent substrate is less than 10 degrees as a contact angle with a liquid having the surface tension of 40 mN/m. In either embodiment, after a photocatalyst-containing layer having the ink-repellent properties as compared with a transparent substrate is formed, a picture element part or a shading part is provided on a part on which a photocatalyst-containing layer is not formed. And when the wettability of the surface of the transparent substrate is less than 10 degrees as a contact angle with a liquid having the surface tension of 40 mN/m, a liquid is easily spread and, for example, in the case of a picture element part, since an ink for an ink jet is uniformly spread, a picture element part having no color nonuniformity is obtained and, thus, a color filter having the high quality can be obtained.

In the present invention, the energy for exposure by irradiation to a photocatalyst-containing layer is usually the light including the ultraviolet ray. However, when formation of the pattern by light picturing irradiation is performed, an exposed part may be formed using as this energy the photocatalystic reaction initiation energy and the reaction rate increasing energy, and irradiating with the reaction rate increasing energy a part irradiated with the photocatalystic reaction initiation energy.

This is to form the pattern of an exposed part by adding the photocatalystic reaction initiation energy to a photocatalyst-containing layer and adding the reaction rate increasing energy by patterning to a region which received this photocatalystic reaction initiation energy. That is, since the formation of the pattern by light picturing irradiation proposed hitherto by the present inventors used the photocatalystic reaction irradiation energy such as the ultraviolet ray, there was problems that the apparatus is expensive, the handling was difficult, the continuous output was not possible, and the like. However, in this method, since the photocatalystic reaction initiation energy such as the ultraviolet ray is added and the pattern is formed using the reaction rate increasing energy such as the infrared ray relative to a region which received the photocatalystic reaction initiation energy, there is the advantages that the reaction rate increasing energy such as the infrared laser which is relatively low cost and is easily handled can be used upon formation of the pattern.

In the present invention, when two kinds of energies of the photocatalystic reaction initiation energy and the reaction rate increasing energy are used, it is preferable that the photocatalystic reaction initiation energy is the light including the ultraviolet ray and the reaction rate increasing energy is the heat energy. This is because titanium dioxide is suitably used as a photocatalyst in the present invention, therefore the ultraviolet ray is preferable as the photocatalystic reaction initiation energy from the relationship of the band gap of this titanium dioxide. In addition, although it is preferable that the reaction rate increasing energy is the heat, it is preferable that the heat energy is added by the infrared laser. This is because a method of using the infrared laser is relatively low coat and is easily handled.

DETAILED DESCRIPTION OF THE PREFERRED EMBODIMENTS

Figure 1:
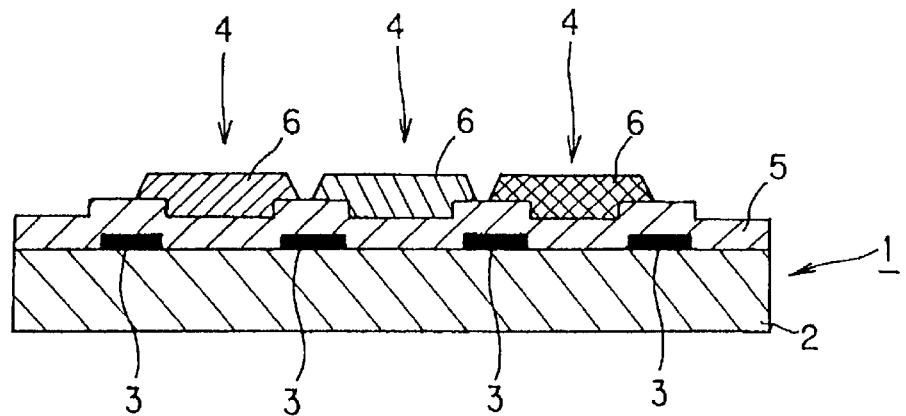
FIG. 1 is a schematic sectional view showing an example of the first embodiment of the color filter according to the present invention.

The present invention will be explained in detail and a color filter is first explained and, then, a process for producing a color filter is explained.

A. Color Filter

First, the color filter according to the present invention is explained. The color filter according to the present invention comprises a transparent substrate, a picture element part in which a plurality of colors are provided in the predetermined pattern with an ink jet system on the transparent substrate, a shading part provided on a border part of the picture element part, and a wettability-variable layer being capable of varying the wettability which is provided for forming the picture element part, or the picture element part and the shading part.

The present invention has a wettability-variable layer in order to form a picture element part as described above, or a picture element part and a shading part. Therefore, since a picture element part or a picture element part and a shading part can be easily formed by varying the wettability of a wettability-variable layer, a color filter having the high quality can be obtained at the low cost. "In order to form a picture element part or a picture element part and a shading part" herein includes the meaning that a picture element part, or a picture element part and a shading part are positioned on a transparent substrate.

As the specific positional relationship of each element of such the color filter, for example, mention may be made of the relationship that at least the picture element part is provided on the wettability-variable layer.

Since at least a picture element part is provided on a wettability-variable layer like this, the wettability of a part on which a picture element part is to be provided in advance can be made into an inkphilic region having the small contact angle with a liquid and the other part can be made into an ink-repellent region having the large contact angle with a liquid. Since an ink is adhered to only an inkphilic region having the small contact angle with a liquid by coloring this part on which a picture element part is to be provided with an inkjet system, an ink is uniformly spread over the whole picture element part, a region having no ink is not present and color nonuniformity and the like do not occur in a picture element part, and an ink is not adhered to the other ink-repellent region.

In addition, as an another specific positional relationship of each element in the color filter according to the present invention, for example, mention may be made of an example in which a wettability-variable layer is formed on a border part of a picture element part. In this case, since an ink is difficult to migrate over a border part of a picture element part having the ink-repellent properties upon coloring with an ink jet system a part on which a picture element part is to be provided by making the wettability of a border part of a picture element part into that of an ink-repellent region having the worse wettability than that of a part on which a picture element part is to be provided, a color filter having no disadvantages such as the ink mixing can be provided. In addition, thereafter, by making a wettability-variable layer of a border part of a picture element part into an inkphilic region having the small contact angle with a liquid by adding the stimulation and the like, a shading part can be easily provided on this border part of the picture element part border and the whole can be easily covered with a protecting layer and, thus, a color filter having the high quality can be obtained.

The color filter according to the present invention, having such the wettability-variable layer is explained in detail below by means of some embodiments.

1. The First Embodiment

The first embodiment of the present invention is a color filter in which a shading part is formed on a transparent substrate, a wettability-variable layer is provided on a picture element part forming portion which is a part on at least this shading part and on the transparent substrate on which the picture element part is to be formed, and further a picture element part can be formed with the better precision by varying the wettability on this wettability-variable layer. This shows an example in which a wettability-variable layer is provided for forming a picture element part and is one of specific examples of a color filter in which the aforementioned at least a picture element part is provided on a wettability-variable layer.

FIG. 1 shows one example of the first embodiment. This color filter 1 has a shading part 3 provided on a transparent substrate 2, a wettability-variable layer 5 provided on a picture element part forming portion 4 which is a part on the shading part 3 and on the transparent substrate 2, on which a picture element part is to be formed, and a picture element part 6 formed on a picture element part forming portion 4 on this wettability-variable layer 5. A picture element part forming portion 4 shows a horizontal-directional position on the surface of a transparent substrate 2 on which a picture element part 6 is to be formed, and may be on a transparent substrate 2 or on a wettability-variable layer 5. In addition, a shading part 3 is also designated as a black matrix and is usually formed on a border part of a picture element part 6.

In a color filter of the first embodiment, a picture element part forming portion 4 on a wettability-variable layer can be converted into an inkphilic region by pattern-irradiating a picture element part forming portion 4 on a wettability-variable layer 5 with the energy. Therefore, by coloring this region with an ink by an ink jet system, the uniform and high quality color filter having no color nonuniformity can be obtained.

In the first embodiment of the present invention, it is preferable that the width of a picture element part 6 is formed wider than that of an opening formed by a shading part 3. By adopting such the constructions, upon mounting this color filter and irradiating with the backlight, the backlight does not pass through a part on which a picture element part is not formed and the high quality color filter having no color missing can be obtained.

Figure 2:
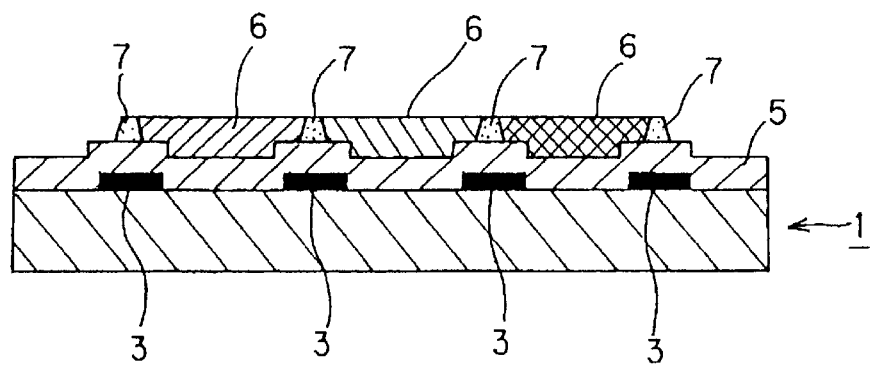
FIG. 2 is a schematic sectional view showing an another example of the first embodiment of the color filter according to the present invention.

FIG. 2 shows an another example of the first embodiment. In this example, an ink-repellent convex part 7 is formed on a wettability-variable layer 5 on a shading part 3. Since an ink-repellent convex part 7 is formed in a color filter 1 of this example like this, an ink is not flown out over this ink-repellent convex part 7 upon adhering an ink to a picture element part forming portion 4 with an ink jet system and, thus, a color filter having a picture element part which does not mix with an ink of an another color can be obtained. In this case, the width of the ink-repellent convex part 7 is not particularly limited but preferably narrower than that of a shading part 3 as shown in FIG. 2. By adopting such the construction, when a picture element part 6 is formed, the width of a picture element part 6 can be wider than that of an opening of a shading part 3, and the aforementioned effects can be obtained. Hence, the high quality color filter having no color missing can be obtained.

Each part constituting such the color filter is explained below.

(Wettability-Variable Layer)

The wettability-variable layer is not particularly limited so long as the wettability of the surface thereof can be varied by the external stimulation, for example, physical stimulation and chemical stimulation. For example, the layer may be a layer in which the state of roughness of the surface is varied by an acid, an alkali and the like and, whereby, the wettability is varied, or a layer in which a substance in the wettability-variable layer is changed by irradiation of the energy such as the ultraviolet light, the visible light and the heat and, whereby, the wettability is changed.

In addition, regarding the change in the wettability, the layer may be a wettability-variable layer in which a contact angle with a liquid is great before the addition of stimulation and a contact angle with a liquid is changed so that it becomes smaller after the addition of stimulation, or a wettability-variable layer in which a contact angle with a liquid is conversely small before the addition of stimulation and a contact angle with a liquid is greatly changed.

(Photocatalyst-Containing Layer)

In the present invention, it is preferable that this wettability-variable layer is a photocatalyst-containing layer in which the wettability changes so that a contact angle with a liquid is reduced by the energy irradiation. The reasons are as follows. By providing a photocatalyst-containing layer in which the wettability changes so that a contact angle with a liquid is reduced by exposure (which means not only the light irradiation but also the energy irradiation in the present invention) like this, the photocatalyst-containing layer can be made into an inkphilic region having the small contact angle with a liquid by pattern-irradiating with the energy to easily change the wettability and, for example, only a part on which a picture element part is to be formed can be easily made into an inkphilic region. Therefore, a color filter can be manufactured effectively and it becomes advantageous in a respect of cost. In this case, it is preferable that the light including the ultraviolet ray is used as the energy.

An inkphilic region herein is a region having the small contact angle with a liquid and is intended to refer to a region having the better wettability relative to an ink for an ink jet, a coating material for a shading part and the like. In addition, an ink-repellent region is a region having the great contact angle with a liquid and is intended to refer to a region having the worse wettability relative to an ink for an ink jet, a coating material for a shading part and the like.

It is preferable that, in the photocatalyst-containing layer, a contact angle with a liquid having the surface tension of 40 mN/m is 10 degrees or more in a part not exposed, preferably a contact angle with a liquid having the surface tension of 30 mN/m is 10 degrees or more and, particularly, a contact angle with a liquid having the surface tension of 20 mN/m is 10 degrees or more. This is because, since a part not exposed is required to be ink-repellent in the present invention, when a contact angle with a liquid is small, the ink-repellent properties are not sufficient and there arises a possibility that an ink or a coating material for a shading part remains, being not preferable.

In addition, it is preferable that the photocatalyst-containing layer is a layer in which a contact angle with a liquid is reduced when exposed and a contact angle with a liquid having the surface tension of 40 mN/m becomes less than 10 degrees, preferably a contact angle with a liquid having the surface tension of 50 mN/m becomes 10 degrees or less and, particularly, a contact angle with a liquid having the surface tension of 60 mN/m becomes 10 degrees or less. When a contact angle with a liquid of an exposed part is high, there is a possibility that the spread of an ink or a coating material for a shading part in this part is inferior and color missing or the like occurs in a picture element part.

A contact angle with a liquid herein is obtained from the results by measuring a contact angle with liquids having various surface tensions using a contact angle measuring apparatus (type CA-Z manufactured by Kyowa Interface science Co., Ltd.) (after 30 seconds from dropping a droplet from a microsyringe) or making a graph from the results. In addition, as liquids having various surface tensions upon this measurement, the wettability index standard solutions manufactured by Junsei Science Co., Ltd. can be used.

It is preferable that a photocatalyst-containing layer in the present invention comprises at least a photocatalyst and a binder. By adopting such the layer, it becomes possible to make the critical surface tension higher by the action of the energy irradiation and a contact angle with a liquid can be reduced.

Although the action mechanism of a photocatalyst representing titanium oxide described below in such the photocatalyst-containing layer is not necessarily clear, it is considered that a carrier produced by the light irradiation has influences on the chemical structure of organic substances by the direct reaction with an adjacent compound or active oxygen species in the presence of oxygen and water.

When a photocatalyst-containing layer is used as a wettability-variable layer in the present invention, the layer can be made into inkphilic by changing the wettability of an exposed part using the action of oxidation, degradation and the like of an organic group which is a portion of a binder or additives with a photocatalyst and, whereby, there can be arisen the great difference in the wettability between an exposed part and an unexposed part. Hence, by enhancing the acceptability (inkphilicity) and the repellent properties (ink-repellent properties) with a coating material for a shading part or an ink of an ink jet system, a color filter having the better quality and which is also advantageous in a respect of cost can be obtained.

In addition, when such the photocatalyst-containing layer is used in the present invention, the photocatalyst-containing layer may be formed such that it contains at least a photocatalyst and fluorine and further the content of fluorine in the surface of this photocatalyst-containing layer is reduced with the aforementioned action of a photocatalyst as compared with before the energy irradiation upon irradiating the photocatalyst-containing layer with the energy.

In a color filter having such the characteristics, a pattern comprising a part having the small content of fluorine can be easily formed by pattern-irradiating with the energy. Here, fluorine has the extremely low surface energy and, for this reason, the surface of a substance having a large amount of fluorine becomes smaller in the critical surface tension. Therefore, the critical surface tension of a part containing a small amount of fluorine becomes greater as compared with the critical surface tension of the surface of a part containing a great amount of fluorine. This means that a part containing a small amount of fluorine becomes an inkphilic region as compared with a part containing a great amount of fluorine. Hence, the formation of a pattern comprising a part having a small amount of fluorine as compared with the surrounding surface results in the formation of an inkphilic region pattern in an ink-repellent region.

Therefore, when such the photocatalyst-containing layer is used, since the pattern of an inkphilic region can be easily formed within an ink-repellent region by pattern-irradiation of the energy, it becomes possible to easily form a picture element part and the like in only this inkphilic region and a color filter having the better quality can be obtained.

It is preferable that, regarding the content of fluorine contained in a photocatalyst-containing layer containing fluorine as described above, the content of fluorine in an inkphilic region having the lower content of fluorine which was formed by the energy irradiation is 10 or less, preferably 5 or less, particularly preferably 1 or less when the fluorine content in a part not irradiated with the energy is 100.

The reasons are as follows. By selecting the fluorine content in such range, it is possible to produce the great difference in the inkphilic properties between the energy-irradiated part and the energy-unirradiated part. Therefore, by forming a picture element part and the like on such the photocatalyst-containing layer, it becomes possible to precisely form a picture element part and the like in only an inkphilic region having the reduced fluorine content and a color filter can be obtained with the better precision. This rate of reduction is based on weight.

Various methods which are generally performed can be used to measure the fluorine content in such the photocatalyst-containing layer and, for example, a method which can quantitatively measure the fluorine amount in the surface such as X-ray Photoelectron Spectroscopy, also called as ESCA (Electron Spectroscopy for Chemical Analysis), fluorescent X-ray analysis, and mass spectroscopy can be used, being not limiting.

As a photocatalyst used in the present invention, mention may be made of photosemiconductors such as titanium oxide ($TiO_2$), zinc oxide (ZnO), tin oxide ($SnO_2$), strontium titanate ($SrTiO_3$), tungten oxide ($WO_3$), bismuth oxide ($Bi_2O_3$), and iron oxide ($Fe_2O_3$). One or more may be selected from them and mixed for use.

In the present invention, particularly, titanium oxide is suitably used because titanium oxide has the high band gap energy, is chemically stable and not toxic, and can be obtained easily. There are two types of titanium oxide, anatase and rutile. Although both can be used in the present invention, anatase-type titanium oxide is preferable. Anatase-type titanium oxide has the excitation wavelength of not greater than 380 nm.

As such the anatase-type titanium oxide, mention may be made of hydrochloric acid-defloccuated-type anatase-type titania sol (STS-02 (average particle size 7 nm) manufactured by Ishihara Sangyo Kaisha, LTD., ST-K01 manufactured by Ishihara Sangyo Kaisha, LTD.), and nitric acid-defloccuated-type anatase-type titania sol (TA-15 (average particle size 12 nm) manufactured by Nissan Chemical Industries, Ltd.).

The small particle size of a photocatalyst is preferable because the photocatalystic reaction occurs effectively. The average particle size of 50 nm or less is preferable and it is particularly preferable to use a photocatalyst having the average particle size of not greater than 20 nm. As the particle size of a photocatalyst is smaller, the surface roughness of a photocatalyst-containing layer becomes smaller, being preferable. When the particle size of a photocatalyst exceeds 100 nm, the central line average surface roughness becomes larger, the ink-repellent properties of an unexposed part of a photocatalyst-containing layer are reduced and manifestation of the inkphilic properties of an exposed part becomes insufficient, being not preferable.

The color filter of the present invention may be a color filter obtained by incorporating fluorine in the surface of a photocatalyst-containing layer as described above, reducing the fluorine content in the surface of a photocatalyst-containing layer by pattern-irradiating the surface of this photocatalyst-containing layer with the energy and, thereby, forming the pattern of an inkphilic region in an ink-repellent region and forming a picture element part and the like thereon. Even in this case, titanium oxide is preferably used as a photocatalyst. The content of fluorine contained in a photocatalyst-containing layer when titanium oxide is used like this, is preferable such that fluorine (F) element is contained in the surface of a photocatalyst-containing layer at an amount of not less than 50, preferably not less than 800, particularly preferably 1200 relative to 100 of titanium (Ti) element as quantitatively determined by analyzing by X-ray photoelectron spectroscopy.

The reasons are as follows. Since it becomes possible to sufficiently reduce the critical surface tension in a photocatalyst-containing layer by inclusion of such a degree of fluorine (F) in a photocatalyst-containing layer, the ink-repellent properties in the surface can be retained and, thereby, the difference in the wettability between the ink-repellent region and an inkphilic region in the surface in the pattern part having the reduced fluorine content by the pattern-irradiation of the energy and the quality of the finally obtained color filter can be improved.

Further, in such the color filter, it is preferable that the fluorine content in an inkphilic region formed by the pattern irradiation of the energy is such that fluorine (F) element is contained at a rate of not greater than 50, preferably not greater than 20, particularly preferably not greater than 10 relative to 100 of titanium (Ti) element.

When the fluorine content in a photocatalyst-containing layer can be reduced to such the degree, the sufficient inkphilic properties can be obtained in order to form a picture element part and the like, it becomes possible to form a picture element part and the like with the better precision due to the difference in the wettability between the inkphilic region and the ink-repellent region not irradiated with the energy, and a color filter having the better quality can be obtained.

In the present invention, it is preferable that a binder used in a photocatalyst-containing layer has such the high binding energy that the principal chain is not degraded by the photoexcitation of the aforementioned photocatalyst, for example, mention may be made of (1) organopolysiloxane which exerts the great strength and which is obtained by hydrolyzing and polymerization-condensing chloro or alkoxysilane by a sol-gel reaction or the like, and (2) organopolysiloxane obtained by cross-linking reactive silicone having the excellent water-repellency and oil-repellency.

In the case of the aforementioned (1), organopolysiloxane which is obtained by hydrolyzing and condensing or co-hydrolyzing and condensing one or more of silicon compounds represented by the general formula:

$$Y_n SiX_{(4-n)}$$

(wherein Y represents alkyl group, fluoroalkyl group, vinyl group, amino group, phenyl group or epoxy group, X represents alkoxyl group, acetyl group or halogen, and n is an integer of 0 to 3). A number of carbon of a group denoted by Y is preferably in a range of 1 to 20 and alkoxyl group denoted by X is preferably methoxy group, ethoxy group, propoxy group, and butoxy group.

More particularly, there can be used methyltrichlorsilane, methyltribromsilane, methyltrimethoxysilane, methyltriethoxysilane, methyltriisopropoxysilane, methyltri-t-butoxysilane; ethyltrichlorsilane, ethyltribromsilane, ethyltrimethoxysilane, ethyltriethoxysilane, ethyltriisopropoxysilane, ethyltri-t-butoxysilane; n-propyltrichlorsilane, n-propyltribromsilane, n-propyltrimethoxysilane, n-propyltriethoxysilane, n-propyltriisopropoxysilane, n-propyltri-t-butoxysilane; n-hexyltrichlorsilane, n-hexyltribromsilane, n-hexyltrimethoxysilane, n-hexyltriethoxysilane, n-hexyltriisopropoxysilane, n-hexyltri-t-butoxysilane; n-decyltrichlorsilane, n-decyltribromsilane, n-decyltrimethoxysilane, n-decyltriethoxysilane, n-decyltriisopropoxysilane, n-decyltri-t-butoxysilane; n-octadecyltrichlorsilane, n-octadecyltribromsilane, n-octadecyltrimethoxysilane, n-octadecyltriethoxysilane, n-octadecyltriisopropoxysilane, n-octadecyltri-t-butoxysilane; phenyltrichlorsilane, phenyltribromsilane, phenyltrimethoxysilane, phenyltriethoxysilane, phenyltriisopropoxysilane, phenyltri-t-butoxysilane, tetrachlorsilane, tetrabromsilane, tetramethoxysilane, tertaethoxysilane, tetrabutoxysilane, dimethoxydiethoxysilane; dimethyldichlorsilane, dimethyldibromsilane, dimethyldimethoxysilane, dimethyldiethoxysilane; diphenyldichlorsilane, diphenyldibromsilane, diphenyldimethoxysilane, diphenyldiethoxysilane; phenylmethyldichlorsilane, phenylmethyldibromsilane, phenylmethyldimethoxysilane, phenylmethyldiethoxysilane; trichlorhydrosilane, tribromhydrosilane, trimethoxyhyrosilane, triethoxyhydrosilane, triisopropoxyhydrosilane, tri-t-butoxyhydrosilane; vinyltrichlorsilane, vinyltribromsilane, vinyltrimethoxysilane, vinyltriethoxysilane, vinyltriisopropoxysilane, vinyltri-t-butoxysilane; trifluoropropyltrichlorsilane, trifluoropropyltribromsilane, trifluoropropyltrimethoxysilane, trifluoropropyltriethoxysilane, trifluoropropyltriisopropoxysilane, trifluoropropyltri-t-butoxysilane; γ-glycidoxypropylmethyldimethoxysilane, γ-glycidoxypropylmethyldiethoxysilane, γ-glycidoxypropyltrimethoxysilane, γ-glycidoxypropyltriethoxysilane, γ-glycidoxypropyltriisopropoxysilane, γ-glycidoxypropyltri-t-butoxysilane; γ-methacryloxypropylmethyldimethoxysilane, γ-methacryloxypropylmethyldiethoxysilane, γ-methacryloxypropyltrimethoxysilane, γ-methacryloxypropyltriethoxysilane, γ-methacryloxypropyltriisopropoxysilane, γ-methacryloxypropyltri-t-butoxysilane; γ-aminopropylmethyldimethoxysilane, γ-aminopropylmethyldiethoxysilane, γ-aminopropyltrimethoxysilane, γ-aminopropyltriethoxysilane, γ-aminopropyltriisopropoxysilane, γ-aminopropyltri-t-butoxysilane; γ-mercaptopropylmethyldimethoxysilane, γ-mercaptopropylmethyldiethoxysilane, γ-mercaptopropyltrimethoxysilane, γ-mercaptopropyltriethoxysilane, γ-mercaptopropyltriisopropoxysilane, γ-mercaptopropyltri-t-butoxysilane; β-3-(3,4-epoxycyclohexyl)ethyltrimethoxysilane, β-(3,4-epoxycyclohexyl)ethyltriethoxysilane; and partial hydrolysate thereof; and mixture thereof.

In addition, as a binder, particularly, polysiloxane containing fluoroalkyl group can be preferably used. More particularly, mention may be made of hydrolyzed and condensed compound and cohydrolyzed and condensed compound of one or more of the following fluoroalkylsilanes. Generally, the known fluorine-contained silane coupling agents can be used.

$CF_3(CF_2)_3CH_2CH_2Si(OCH_3)_3$;
$CF_3(CF_2)_5CH_2CH_2Si(OCH_3)_3$;
$CF_3(CF_2)_7CH_2CH_2Si(OCH_3)_3$;
$CF_3(CF_2)_9CH_2CH_2Si(OCH_3)_3$;
$(CF_3)_2CF(CF_2)_4CH_2CH_2S(OCH_3)_3$;
$(CF_3)_2CF(CF_2)_6CH_2CH_2Si(OCH_3)_3$;
$(CF_3)_2CF(CF_2)_8CH_2CH_2Si(OCH_3)_3$;
$CF_3(C_6H_4)C_2H_4Si(OCH_3)_3$;
$CF_3(CF_2)_3(C_6H_4)C_2H_4Si(OCH_3)_3$;
$CF_3(CF_2)_5(C_6H_4)C_2H_4Si(OCH_3)_3$;
$CF_3(CF_2)_7(C_6H_4)C_2H_4Si(OCH_3)_3$;
$CF_3(CF_2)_3CH_2CH_2SiCH_3(OCH_3)_2$;
$CF_3(CF_2)_5CH_2CH_2SiCH_3(OCH_3)_2$;
$CF_3(CF_2)_7CH_2CH_2SiCH_3(OCH_3)_2$;
$CF_3(CF_2)_9CH_2CH_2SiCH_3(OCH_3)_2$;
$(CF_3)_2CF(CF_2)_4CH_2CH_2SiCH_3(OCH_3)_2$;
$(CF_3)_2CF(CF_2)_6CH_2CH_2SiCH_3(OCH_3)_2$;
$(CF_3)_2CF(CF_2)_8CH_2CH_2SiCH_3(OCH_3)_2$;
$CF_3(C_6H_4)C_2H_4SiCH_3(OCH_3)_2$;
$CF_3(CF_2)_3(C_6H_4)C_2H_4SiCH_3(OCH_3)_2$;
$CF_3(CF_2)_5(C_6H_4)C_2H_4SiCH_3(OCH_3)_2$;
$CF_3(CF_2)_7(C_6H_4)C_2H_4SiCH_3(OCH_3)_2$;
$CF_3(CF_2)_3CH_2CH_2Si(OCH_2CH_3)_3$;
$CF_3(CF_2)_5CH_2CH_2Si(OCH_2CH_3)_3$;
$CF_3(CF_2)_7CH_2CH_2Si(OCH_2CH_3)_3$;
$CF_3(CF_2)_9CH_2CH_2Si(OCH_2CH_3)_3$;
$CF_3(CF_2)_7SO_2N(C_2H_5)C_2H_4CH_2Si(OCH_3)_3$

By using polysiloxane containing aforementioned fluoroalkyl group is used as a binder, the ink-repellent properties in a photocatalyst-containing layer are remarkably improved and the function of preventing a coating material for a shading part or an ink for an ink jet system from adhering is manifested.

In addition, as a reactive silicone of the aforementioned (2), mention may be made of compounds having a chemical structure represented by the following general formula:

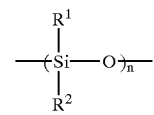

wherein n is an integer of not smaller than 2, $R^1$ and $R^2$ are each substituted or unsubstituted alkyl, alkenyl, aryl or cyanoalkyl group having 1–10 carbon numbers, respectively, and not greater than 40% of the whole in moles is vinyl, phenyl or halogenated phenyl. In addition, the compounds wherein $R^1$ and $R^2$ are methyl group are preferable because the surface energy becomes the smallest. Am amount of not smaller than 60% in terms of a mole rate of methyl group is preferable. In addition, a molecular chain has at least one reactive group such as hydroxy group at an end of a chain and a side chain.

In addition, an stable organosilicon compound which does not perform a cross-linking reaction such as dimethylpolysiloxane may be mixed into a binder together with the aforementioned organopolysilicon.

In the color filter of the invention, various binders such as organopolysiloxane and the like can be used in a photocatalyst-containing layer like this. In the present invention, as described above, fluorine in the surface of a photocatalyst-containing layer may be reduced and, thereby, an inkphilic region may be formed within an ink-repellent region by incorporating fluorine in a photocatalyst-containing layer containing such the binder and the photocatalyst and pattern-irradiating with the energy. Upon this, fluorine needs to be contained in a photocatalyst-containing layer and, as a method of incorporating fluorine into such the photocatalyst-containing layer containing a binder, mention may be made of a method of binding a fluorine compound with a binder which usually have the high binding energy, using the relatively weak binding energy, and a method of mixing into a photocatalyst-containing layer a fluorine compound which is bound by the relatively weak binding energy. By introducing fluorine by such the method, when the energy is irradiated, a fluorine-bound site having the relatively small binding energy is first degraded and, thereby, fluorine can be removed from a photocatalyst-containing layer.

As the aforementioned first method, that is, a method of binding a fluorine compound with a binder which have the high binding energy using the relatively weak binding energy, mention may be made of a method of introducing a fluoroalkyl group as a substituent into the aforementioned organopolysiloxane.

For example, as a method of obtaining organopolysiloxane, organopolysiloxane which exerts the great strength can be obtained by hydrolyzing and polymerization condensing chloro or alkoxysilane and the like by a sol-gel reaction, which is described as (1). Here, in this method, organopolysiloxane is obtained by hydrolyzing and condensing or cohydrolyzing and condensing one or more of silicon compounds represented by the general formula:

$Y_nSiX_{(4-n)}$ (wherein Y represents alkyl group, fluoroalkyl group, vinyl group, amino group, phenyl group or epoxy group, X represents alkoxyl group, acetyl group or halogen, and n is an integer of 0 to 3) as described above. By using a silicon compound having a fluoroalkyl group as a substituent Y in this general formula, organopolysiloxane having a fluoroalkyl group as a substituent can be obtained. When such the organopolysiloxane having a fluoroalkyl group as a substituent group is used as a binder, since a part of a carbon—carbon bond of a fluoroalkyl group is degraded by the action of a photocatalyst in a photocatalyst-containing layer upon the energy irradiation, the fluorine content of a part of the surface of a photocatalyst-containing layer irradiated with the energy can be reduced.

As a silicon compound having a fluoroalkyl group using upon this, a silicon compound having at least one fluoroalkyl group and in which a number of a carbon element in this fluoroalkyl group is 4 to 30, preferably 6 to 20, particularly preferably 6 to 16 is suitably used, being not limiting. Specific examples of such the silicon compound are described as above and, inter alia, the silicon compound having a fluoroalkyl group in which a number of carbon element is 6 to 8 is preferable.

In the present invention, such the silicon compound having a fluoroalkyl group may by used by mix with a silicon compound having no fluoroalkyl group as described above, and a co-hydrolyzed and condensed compound of which may be used as the organopolysiloxane. Alternatively, one or more of such the silicon compounds having the fluoroalkyl group may be used, and a hydrolyzed and condensed compound or a co-hydrolyzed and condensed compound of which may be used as the organopolysiloxane.

In organopolysiloxane having a fluoroalkyl group thus obtained, it is preferable that, among silicon compounds constituting this organopolysiloxane, the silicon compound having a fluoroalkyl group is contained at an amount of not less than 0.01 mol %, preferably not less than 0.1 mol %.

The reasons are as follows. By incorporating such the degree of fluoroalkyl group, the ink-repellent properties on a photocatalyst-containing layer can be enhanced and the difference in the wettability between a part of an ink-repellent region and a part which was converted into an inkphilic region by the energy irradiation can be made to be larger.

In addition, in the method shown by the above (2), organopolysiloxane is obtained by cross-linking a reactive silicone having the excellent water-repellency and oil-repellency. Similarly also in this case, by using a substituent containing fluorine such as fluoroalkyl group and the like as either $R^1$ or $R^2$ in the above general formula or both, fluorine can be contained in a photocatalyst-containing layer. In addition, since a part of a fluoroalkyl group having the smaller binding energy than siloxane bond is degraded when the energy is irradiated, the fluorine content in the surface of a photocatalyst-containing layer can be reduced by the energy irradiation.

On the other hand, as an example of the latter, that is, a method of introducing a fluorine compound which is bound by the weaker energy than the binding energy of a binder, mention may be made of a method of mixing a fluorine-contained surfactant therein when a fluorine compound having a low molecular weight is introduced and, as a method of introducing a fluorine compound having a high molecular weight, mention may be made of a method of mixing a fluorine-contained resin having the high compatibility with a binder resin.

In the present invention, a photocatalyst-containing layer may contain a surfactant besides the aforementioned photocatalyst and binder. More particularly, mention may be made of a hydrocarbon nonionic surfactant such as NIKKOL BL, BC, BO, BB series manufactured by Nikko Chemicals Co., ltd., and a fluorine-contained or silicone-contained nonionic surfactant such as ZONYL FSN, FSO manufactured by Dupont Co., Ltd., Surfron S-141 and 145 manufactured by Asahi Glass Co., Ltd., Megafack F-141 and 144 manufactured by Dainippon Ink & Chemicals Co., Ltd., Ftagent F-200 and F251 manufactured by Neos Co., Ltd., Unidyne DS-401 and 402 manufactured by Daikin Industries, Ltd., Florad FC-170 and 176 manufactured by 3M Co., Ltd. Alternatively, cationic surfactant, anionic surfactant and amphoteric surfactant may be used.

In addition, a photocatalyst-containing layer may contain an oligomer and a polymer such as polyvinylalcohol, unsaturated polyester, acrylic resin, polyethylene, diallyl phthalate, ethylene propylene diene monomer, epoxy resin, phenol resin, polyurethane, melamine resin, polycarbonate, polyvinyl chloride, polyamide, polyimide, styrene butadiene rubber, chloroprene rubber, polypropylene, polybutylene, polystyrene, polyvinyl acetate, polyester, polybutadiene, polybenzimidazole, polyacrylnitrile, epichlorhydrin, polysulfide, polyisoprene, and the like in addition to the aforementioned surfactants.

The content of a photocatalyst in a photocatalyst-containing layer can be set in a range of 5 to 60% by weight, preferably 20 to 40% by weight. In addition, the thickness of a photocatalyst-containing layer is preferably in a range of 0.05 to 10 μm.

The aforementioned photocatalyst-containing layer can be formed by dispersing a photocatalyst and a binder and, if needed, other additives in a solvent to prepare a coating solution, and applying this coating solution. As a solvent used, an alcoholic organic solvent such as ethanol, isopropanol and the like is preferable. Applying can be performed by the known applying method such as spin coating, spray coating, dip coating, roll coating, bead coating or the like. When an ultraviolet-curing type binder is contained as a binder, a photocatalyst-containing layer can be formed by performing the curing treatment by the ultraviolet ray irradiation.

(Picture Element Part)

In the aforementioned first embodiment, a picture element part 6 is provided on a wettability-variable layer 5, inter alia, the aforementioned photocatalyst-containing layer as shown in FIG. 1 and FIG. 2. In the first embodiment, a picture element part is formed in an inkphilic region having the low contact angle with a liquid in the predetermined pattern by a plurality of colors of inks with an ink jet system by exposing the aforementioned photocatalyst-containing layer. A picture element part is usually formed of three colors of red (R), green (G) and blue (B). The coloring pattern and an area to be colored in this picture element part can be set arbitrarily.

Inks for an ink jet system for forming such the picture element part are roughly divided into an aqueous ink and an oil based ink. Although any ink can be used in the present invention, an aqueous ink based on water is preferable in a respect of the surface tension.

Water alone or a mixed solvent of water and a water-soluble organic solvent can be used as a solvent for an aqueous ink used in the present invention. On the other hand, an ink based on a solvent having a high boiling point is preferably used for an oil based ink in order to prevent the choking of a head. As a coloring agent used for such the ink for an ink jet system, the known pigments and dyes are widely used. In addition, insoluble or soluble resins may be contained in a solvent in order to improve the dispersibility and the fixing properties. Other components such as surfactant containing nonionic surfactant, cationic surfactant and amphoteric surfactant; preservative; antifungal agent; pH adjusting agent; anti-foaming agent; ultraviolet absorbing agent; viscosity adjusting agent; surface tension adjusting agent and the like may be added thereto as the occasion demands.

In addition, although the conventional ink for an ink jet system can not contain a large amount of a binder resin due to the low suitable viscosity, it is possible to impart the fixing ability to a coloring agent itself by granulating so as to wrap a coloring agent particle with a resin in an ink. Such the ink can be also used in the present invention. Further, so-called hot melt ink and UV-curing ink may be used.

In the present invention, inter alia, an UV-curing ink is preferably used. By using a UV-curing ink, a picture element part is formed by coloring with an ink jet system and, thereafter, UV is irradiated and, thereby, an ink can be cured rapidly which can sent to a next step immediately. Therefore, a color filter can be manufactured effectively.

Such the UV-curing ink has a prepolymer, a monomer, a photopolymerization initiator and a coloring agent as a main component. As a prepolymer, any prepolymer such as polyesteracrylate, polyurethaneacrylate, eposyacrylate, polyetheracrylate, oligoacrylate, alkydacrylate, polyolacrylate, siliconacrylate and the like can be used without limitation.

As a monomer, vinyl monomer such as styrene, vinyl acetate and the like; monofunctional acrylic monomer such as n-hexylacrylate and phenoxyethylacrylate; and multi-functional acrylic monomer such as diethylene glycol diacrylate, 1,6-hexanediol diacrylate, hydroxypiperic ester neopentylglycol diacrylate, trimethylolpropane triacrylate, dipentaerhythritolhexane acrylate and the like can be used. The aforementioned prepolymers and monomers may be used alone or in a mixture of two or more of them.

As a photopolymerization initiator, an initiator which imparts the desired curing properties and the desired recording properties can be selected for use among isobutylbenzoin ether, isopropylbenzoin ether, benzoin ethyl ether, benzoin methyl ether, 1-phenyl-1,2-propadione-2-oxime, 2,2-dimethoxy-2-phenylacetophenone, benzil, hydroxycyclohexyl phenyl ketone, diethoxyacetophenone, 2-hydroxy-2-methyl-1-phenylpropane-1-one, benzophenone, chlorothioxanthone, 2-chlorothioxanthone, isopropylthioxanthone, 2-methylthioxanthone, chlorine-substituted benzophenone, halogen-substituted alkyl-allylketone and the like. Other components such as photo-initiator assistant such as aliphatic amine, aromatic amine and the like; photosensitizer such as thioxanthosone and the like may be added thereto as the occasional demands.

(Shading Part)

In the first embodiment of the present invention, a shading part 3 is formed on a transparent substrate 2 and in a border part of the aforementioned picture element part forming portion 4 as shown in FIG. 1 and FIG. 2.

It is preferable that a shading part in the present invention is formed by forming a metal film of chromium or the like having the thickness of around 1000 to 2000 Å by a sputtering method, a vacuum metallizing method or the like and patterning this film. As this patterning method, the conventional patterning method such as sputtering and the like can be used.

Alternatively, the shading part may be a layer containing a shading particle such as a carbon fine particle, a metal oxide, an inorganic pigment, an organic pigment, and the like in a resin binder. As a resin binder used, alone or a mixture of two or more of a polyimide resin, an acrylic resin, an epoxy resin, polyacrylamide, polyvinyl alcohol, gelatin, casein, cellulose and the like, a photosensitive resin, an O/W emulsion-type resin composition, for example, an emulsified reactive silicone can be used. The thickness of such the resin shading part can be set in a range of 0.5 to 10 $\mu$m. As a method of patterning such the resin shading part, methods which are generally used such as a photolithography method and a printing method can be used.

(Transparent Substrate)

In the first embodiment of the present invention, the aforementioned shading part 3 or wettability-variable later 5, inter alia, the aforementioned photocatalyst-containing layer is provided on a transparent substrate 2 as shown in FIG. 1 and FIG. 2.

As this transparent substrate, substrates which have hitherto been used for a color filter can be used, without limitation, such as a transparent rigid material having no flexibility such as quartz glass, Pyrex glass, synthetic quartz glass and the like, or a transparent flexible material having the flexibility such as a transparent resin film, a resin plate for optics and the like. Among them, 7059 glass manufactured by Corning Co., Ltd. is a material having the small thermal expansion coefficient and is excellent in the dimensional stability and the workability at heat-treatment at an elevated temperature and, additionally, since it is non-alkali glass containing no alkaline component in a glass, it is suitable for a color filter for a color liquid crystal display apparatus by an active matrix system. In the present invention, a transparent material is usually used for a transparent substrate and a reflective substrate and white-colored substrate may be used. Alternatively, as a transparent substrate, substrates having the surface treated for preventing the alkali dissolution or for imparting the gas barrier properties or for other objects may be used.

(Ink-Repellent Convex Part)

In the first embodiment of the present invention, an ink-repellent convex part 7 may be formed on a wettability-variable layer 5 which covers an upper part of a shading part 3 as shown in FIG. 2. The composition of such the ink-repellent convex part is not particularly limited as long as it is a resin composition having the ink-repellent properties. In addition, the composition is not necessarily transparent and may be colored. For example, a material which is used for a black matrix (shading part) and which is a material with no black material incorporated therein can be used. More particularly, mention may be made of a composition of a water soluble resin such as polyacrylamide, polyvinyl alcohol, gelatin, casein, cellulose and the like alone or a mixture of two or more of them, and a resin composition such as O/W emulsion, for example, an emulsified reactive silicone. In the present invention, a photocuring resin is suitable used for the reasons of easy handling and curing. In addition, since this ink-repellent convex part is preferable as it grows ink-repellent, the surface thereof may be treated with an ink-repellent treating agent such as a silicone compound and a fluorine-containing compound.

An ink-repellent convex part in the aforementioned first embodiment is preferably relatively higher because it is provided for preventing an ink from mixing upon coloring with an ink jet system but, in view of the flatness of the whole when it is made into a color filter, the thickness near that of a picture element part is preferable. More particularly, it is usually preferably in a range of 0.1 to 2 μm although it is different depending upon an accumulated amount of an ink blown.

(Protecting Layer)

In the first embodiment, a protecting layer may be further formed on a picture element part 6 though not shown in FIG. 1 or FIG. 2. This protecting layer is provided for flattening a color filter and at the same time preventing components contained in a picture element part, or a picture element part and a photocatalyst-containing layer from dissolving into a liquid crystal layer.

The thickness of a protecting layer can be set in view of the light transmittance of a material used, the surface condition of a color filter and the like and, for example, it can be set in a range of 0.1 to 2.0 μm. A protecting layer can be formed using a resin having the light transmittance required for a transparent protecting layer among the known transparent photosensitive resin, two-pack curing type transparent resin and the like.

2. The Second Embodiment

The second embodiment of the present invention is a color filter in which a wettability-variable layer is formed on the whole a surface of a transparent substrate and a picture element part and a shading part are provided at the predetermined position on this wettability-variable layer. This indicates an example in which a wettability-variable layer is provided for forming a picture element part and a shading part and one specified example of the aforementioned color filter in which at least a picture element part is provided on a wettability-variable layer.

Figure 3:
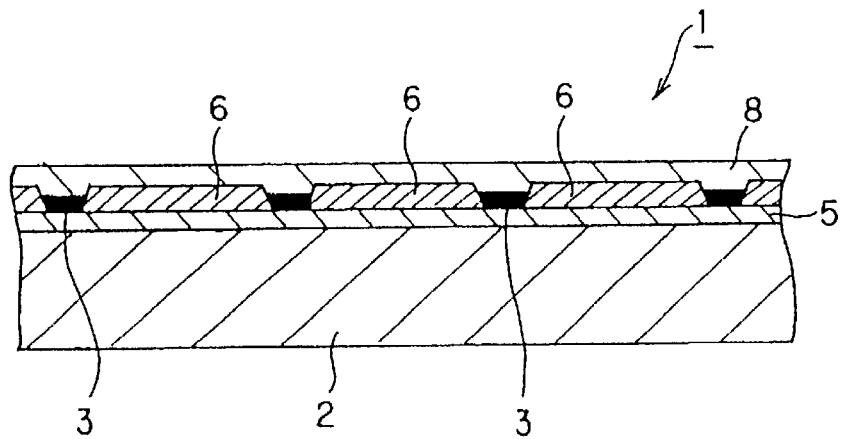
FIG. 3 is a schematic sectional view showing one example of the second embodiment of the color filter according to the present invention.

FIG. 3 shows an example of the second embodiment. This color filter 1 is formed of a wettability-variable layer 5 provided on a transparent substrate 2, a shading part 3 and a picture element part 6 formed on this wettability-variable layer 5 and a protecting layer 8 provided on this picture element part 6 and shading part 3.

In this color filter of the second embodiment, a picture element part 6 and a shading part 3 are formed on a wettability-variable layer 5. However, as described in detail in a process for production, the wettability is reduced by irradiating a picture element part forming portion of a picture element part 6 with the energy in advance, and a picture element part 6 is formed on this part and, thereafter, the wettability of a wettability-variable layer 5 in a shading part forming portion of a shading part 3 is reduced and a shading part 3 may be formed thereon or, alternatively conversely, the wettability of a shading part forming portion is reduced in advance and a shading part is formed and, thereafter, the wettability of a wettability-variable layer of a picture element part forming portion is reduced and a picture element part 6 may be formed.

In either method for producing a color layer, since an inkphilic region is formed in which the wettability of a wettability-variable layer is reduced when a picture element part 6 is formed, an ink is uniformly spread within this picture element part forming portion when the ink is adhered with an ink jet system, and a color filter having no color nonuniformity can be obtained. In addition, upon coloring of a picture element part with an ink jet system, a shading part 3 is formed in its surroundings, or the surroundings are the state where the wettability of a wettability-variable layer is not changed, that is, an ink-repellent region. Therefore, inks are not mixed over this part and a color filter having no disadvantages such as color mixing and the like can be obtained.

Since a material and the like of a transparent substrate 2, a shading part 3, a wettability-variable layer 5, a picture element part 6 and a protecting layer 8 used in this embodiment are similar to those of the aforementioned first embodiment, they are not explained here. In addition, in this embodiment, since a shading part is formed on a wettability-variable layer, a shading part is easily formed by forming a part having the better wettability in a wettability-variable layer in advance and applying a coating material for a shading part on the part. Therefore, it can be said that a shading part is preferably formed using a coating material for a shading part obtained by dissolving the aforementioned shading fine particle and a resin in a solvent or the like.

3. The Third Embodiment

The third embodiment of the present invention is a color filter in which the aforementioned shading part is provided on a transparent substrate, a wettability-variable layer is provided on a picture element part forming portion on the transparent substrate, which is a part on which a picture element part is to be formed, and a picture element part is provided on this wettability-variable layer. This shows an example in which a wettability-variable layer is provided for forming a picture element part and a shading part and, as described above, is one specified examples of a color filter in which at least a picture element part is provided on a wettability-variable layer.

Figure 4:
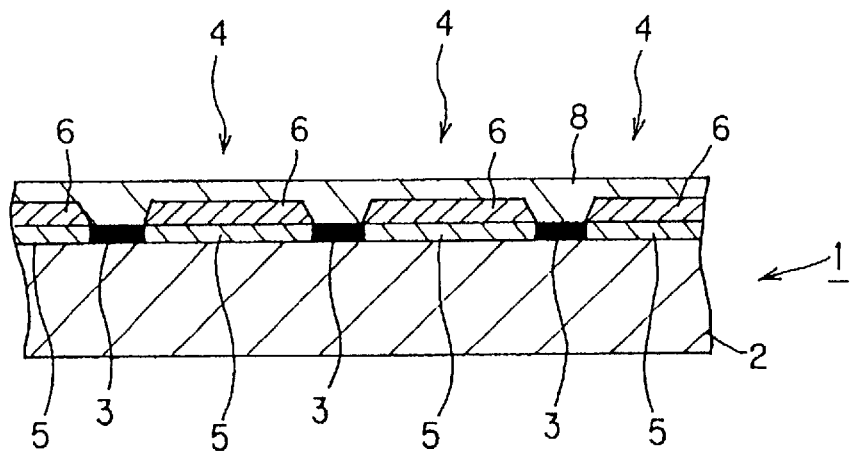
FIG. 4 is a schematic sectional view showing one example of the third embodiment of the color filter according to the present invention.

FIG. 4 shows one example of the third embodiment. This color filter 1 is formed of a shading part 3 provided on a transparent substrate 2, a wettability-variable layer 5 formed in a pattern like state on a picture element part forming portion 4 which is a region between the aforementioned shading parts 3 on a transparent substrate 2, a picture element part 6 formed on this wettability-variable layer 5 and further a protecting layer 8 formed on this picture element part 6 and shading part 3.

The characteristics of this embodiment are in that a wettability-variable layer is provided on only a picture element part forming portion 4 on a transparent substrate 2 and a wettability-variable layer 5 is not formed on a shading part forming portion on which a shading part 3 is to be formed. Since a wettability-variable layer 5 is formed on only a picture element part forming portion in the third embodiment like this, when the wettability is changed by adding the stimulation to a wettability-variable layer, the stimulation may be added over the whole side and the stimulation does not necessarily be added in a pattern like state. Therefore, there are effects that steps after formation of a wettability-variable layer may be simplified.

In this embodiment, since a shading part 3 is provided just on a transparent substrate 2, it is preferable that a transparent substrate 2 is inkphilic. In particular, when a wettability-variable layer 5 is formed in a pattern like state and, thereafter, a shading part 3 is formed on a shading part forming portion therebetween, it is preferable that a surface of a transparent substrate 2 is an inkphilic region compared with a wettability-variable layer which is an ink-repellent region before the change in the wettability in view of formation of a shading part 3. Therefore, in the third embodiment, it is preferable that the wettability on a transparent substrate 2 is less than 10 degrees as the contact angle with a liquid having the surface tension of 40 mN/m, more preferably less than 5 degrees, particularly preferably less than 1 degree.

As a transparent substrate, the surface of which is an inkphilic region, there are a substrate formed of an inkphilic material, a substrate obtained by treating the surface of a material so as to make the surface inkphilic, and an inkphilic layer is formed on a transparent surface, being not limiting in this embodiment.

As an example in which the surface of a material is treated so as to make the surface inkphilic, mention may be made of the inkphilic surface treatment with the plasma treatment utilizing argon and water, and as an inkphilic layer provided on a transparent substrate, mention may be made of a silica membrane obtained by a sol-gel method using tetraethoxysilane.

Since materials and the like used in this embodiment other than a transparent substrate 2, that is, a shading part 3, a wettability-variable layer 5, a picture element part 6 and a protecting layer 8 are similar to those of the aforementioned first embodiment, they are not explained here.

4. The Fourth Embodiment

The fourth embodiment of the present invention is a color filter in which a shading part is formed on a transparent substrate, a wettability-variable layer is formed on this shading part, and a picture element part is formed between the wettability-variable layers. This shows an example in which a wettability-variable layer is provided for forming a picture element part and one of specified examples of the aforementioned color filter in which a wettability-variable layer is provided on a border part of a picture element part.

Figure 5:
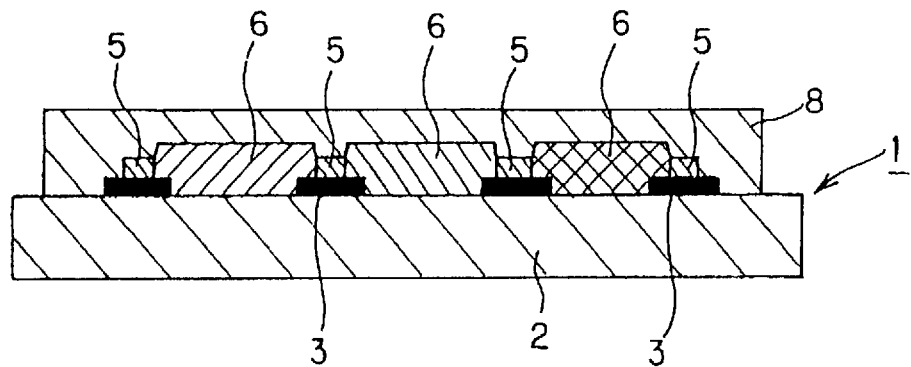
FIG. 5 is a schematic sectional view showing one example of the fourth embodiment of the color filter according to the present invention.

FIG. 5 shows one example of the present fourth embodiment. In this color filter 1, a shading part 3 is formed on a transparent substrate 2, and a wettability-variable layer 5 is formed on this shading part 3. Further, a picture element part 6 is formed on a part between the wettability-variable layers 5. And, a protecting layer 8 is formed so that it covers an upper part of this picture element part 6 and wettability-variable layer 5. In this embodiment, since a wettability-variable layer is formed in a pattern like state, the wettability of a wettability-variable layer may be changed by adding the stimulation over the whole surf ace, for example, the pattern-irradiation of the energy utilizing a mask does not necessarily need to be performed upon formation of a picture element part 6 and steps can be simplified. In addition, since a wettability-variable layer 5 is formed on only a border part of a picture element part 6, an amount thereof to be used is extremely small. Therefore, it is effective, for example, when there is a problem on applying of a large amount of a wettability-variable layer on a color filter that it is expensive.

Here, the width of this wettability-variable layer 5 is preferably formed narrower than that of a shading part 3. Since the width of this wettability-variable layer 5 is narrower than that of shading part 3, the width of a picture element part 6 formed between wettability-variable layers can be formed larger than that of an opening of a shading part 3. Thereby, disadvantages such as color missing can be prevented.

In addition, in this embodiment, since a shading part 3 and a picture element part 6 are formed just on a transparent substrate 2, it is preferable that a transparent substrate 2 is inkphilic on the surface thereof. In particular, when a picture element part 6 is formed between wettability-variable layers 5 by adhering with an ink jet system, an ink is uniformly spread as the wettability on this transparent substrate 2 grows more inkphilic and disadvantages such as color nonuniformity and the like hardly occur. Therefore, also in the fourth embodiment, as in the third embodiment, it is preferable that the wettability on a transparent substrate 2 is less than 10 degrees as the contact angle with a liquid having the surface tension of 40 mN/m.

Regarding materials used in this embodiment, a material for a transparent substrate is similar to that of the third embodiment and other materials are similar to those of the first embodiment, they are not explained here.

5. The Fifth Embodiment

The fifth embodiment of the present invention is a color filter in which a wettability-variable layer is formed on a shading part forming portion on a transparent substrate on which a shading part is to be formed, a shading part is formed on this wettability-variable layer and a picture element part is formed between the shading parts. This shows an example in which a wettability-variable layer is provided for forming a picture element part and a shading part and one of specific examples of the aforementioned color filter in which a wettability-variable layer is provided on a border part of a picture element part.

Figure 6:
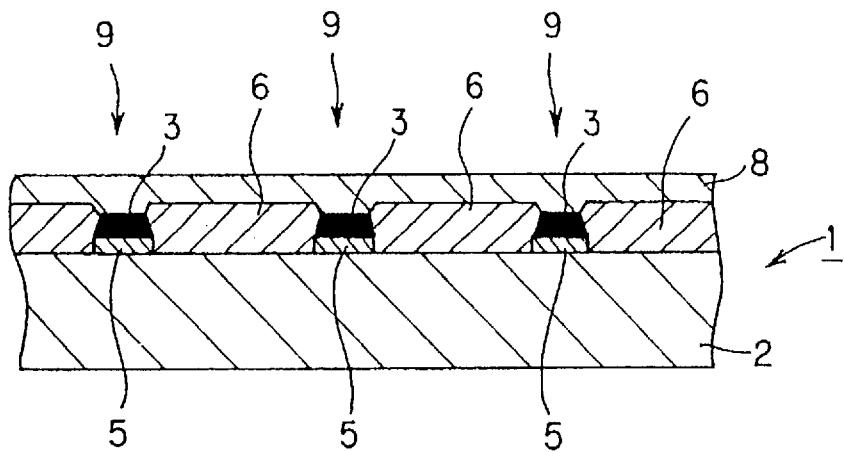
FIG. 6 is a schematic sectional view showing one example of the fifth embodiment of the color filter according to the present invention.

FIG. 6 shows one example of the present fifth embodiment of the present invention. In this color filter 1, wettability-variable layer 5 is formed in a pattern like state on a shading part forming portion 9 on a transparent substrate 2 on which a shading part is to be formed, and a picture element part 6 is formed on a transparent substrate 2 between the wettability-variable layers 5 formed in a pattern like state. In addition, a shading part 3 is formed on the aforementioned wettability-variable layer 5.

In this embodiment, since a wettability-variable layer is formed in the pattern-like and the stimulation may be added to the whole surface in order to change the wettability of a wettability-variable layer, for example, it is not necessary to perform the pattern-irradiation of the energy utilizing a mask upon formation of a picture element part 6 and steps can be simplified. In addition, as in the fourth embodiment, since a wettability-variable layer 5 is formed on only a border part of a picture element part 6 and, in the case of this embodiment, on only a shading part forming portion 9, an amount thereof to be used is small. Therefore, it is effective when there is a problem on formation of a large amount of a wettability-variable layer on a color filter.

In addition, in this embodiment, since a picture element part 6 is formed just on a transparent substrate 2 as in the aforementioned forth embodiment, it is preferable that a transparent substrate 2 is inkphilic on the surface. Therefore, also in the fifth embodiment, as in the third embodiment and the fourth embodiment, it is preferable that the wettability on a transparent substrate 2 is less than 10 degrees as the contact angle with a liquid having the surface tension of 40 mN/m.

As materials used in this embodiment, a material for a transparent substrate is similar to that of the aforementioned third embodiment and other materials are similar to those of the aforementioned first embodiment, they are not explained here.

B. A Process for Producing a Color Filter

Then, a process for producing a color filter of the present invention will be explained using some embodiments.

1. The Sixth Embodiment

The sixth embodiment of the present invention is a process for producing a color filter which is the aforementioned first embodiment in the present invention, and said process has (1) a step of forming a shading part on a transparent substrate;

(2) a step of providing, on a surface of the transparent substrate on which a shading part was formed, a photocatalyst-containing layer having the wettability of a part irradiated with the energy which changed in a direction of reduction of a contact angle with a liquid;

(3) a step of irradiating with the energy a picture element part forming portion on this photocatalyst-containing layer on which a picture element part is to be formed, to form an exposed part for a picture element part; and (4) a step of coloring this exposed part for a picture element part with an inkjet system to form a picture element part.

(Explanation of Each Step)

FIG. 7 is for explaining each step of the sixth embodiment of the present invention. In this example, first, a shading part 3 is formed on a transparent substrate 2 by the conventional method (FIG. 7(A)). A process for manufacturing this shading part 3 is not particularly limited, for example, mention may be made of a method of forming it by forming a metal film such as chrome having the thickness of around 1000 to 2000 Å by a sputtering method, a vacuum-metallizing method or the like and patterning this film.

Figure 7A:
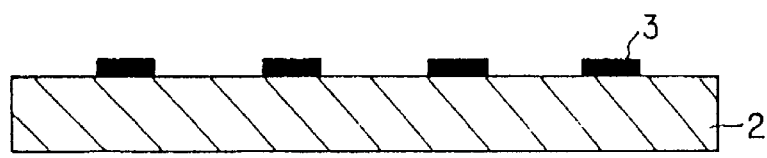
FIG. 7 is a process drawing for explaining the sixth embodiment of a process for producing the color filter according to the present invention.
Figure 7B:
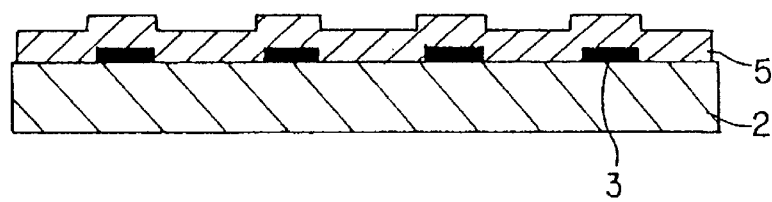
Figure 7C:
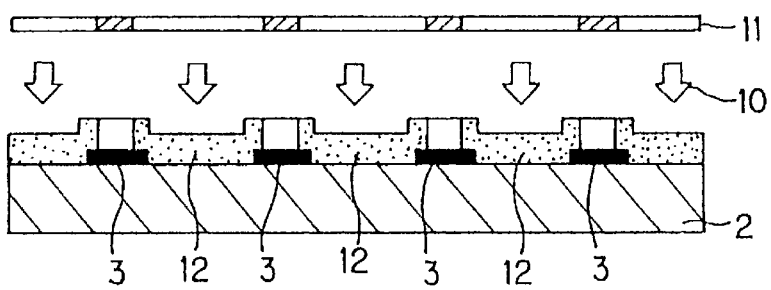

Then, a photocatalyst-containing layer 5 is formed on a transparent substrate 2 on which this shading part 3 is formed (FIG. 7(B)). This photocatalyst-containing layer 5 is formed by dispersing the aforementioned photocatalyst and binder in a solvent, if necessary, together with other additives to prepare a coating solution, applying this coating solution, and proceeding the hydrolyzing and polymerization condensing reaction to fix firm a photocatalyst in a binder. As a solvent, alcoholic organic solvents such as ethanol, isopropylalcohol and the like are preferable, and applying can be performed by the known applying method such as spin coating, spray coating, dip coating, roll coating, bead coating or the like.

A transparent substrate 2 on which a photocatalyst-containing layer 5 is formed is pattern-irradiated with the energy 10 such as the ultraviolet light or the like using a mask 11. Thereby, there is formed an exposed part for a picture element part 12 in which a picture element part forming portion on a photocatalyst-containing layer 5 on which a picture element part is to be formed, was converted into an inkphilic region by the action of a photocatalyst in a photocatalyst-containing layer 5 (FIG. 7(C)).

When exposure is performed using a photomask 11 for forming an exposed part for a picture element part 12 like this, it is preferable that the width of an exposed part for a picture element part 12 formed by the energy irradiation, that is, the width of a picture element part to be formed, is wider than that of an opening formed by a shading part 3. This is because such the width eliminates a possibility that the backlight passes through a part on which a picture element part is not formed when irradiated with the backlight after the completion of a liquid crystal panel, and disadvantages such as color missing and the like do not occur.

Figure 8:
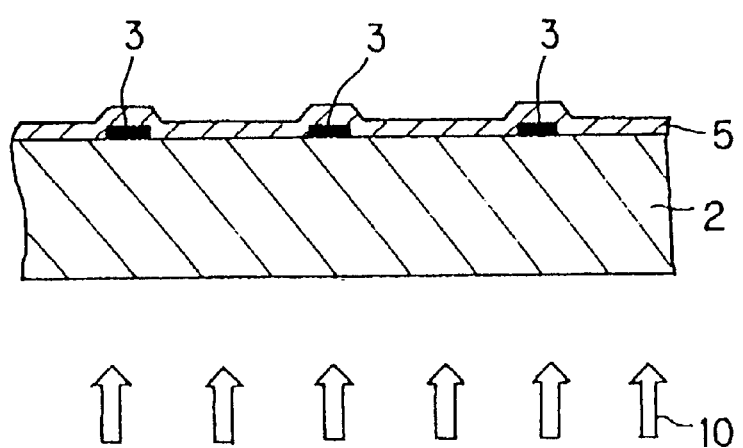
FIG. 8 is a schematic view for explaining an another example of exposing method for a picture element part in the process for producing a color filter shown in FIG. 7.

This energy irradiation can be also performed by the whole surface exposure from a transparent substrate 2 side as shown in FIG. 8. When the whole surface is irradiated with the energy from a transparent substrate 2 side, a shading part exerts as a mask as apparent from FIG. 8 and the exposure is performed on only a part having no shading part 3. According to this method, since the energy irradiation can be performed without using a mask for forming a picture element part, it can be said to be advantageous in a respect of cost.

In addition, when the energy is irradiated from a transparent substrate 2 side, it is preferable that a material through which the energy passes is used for a transparent substrate 2 and, for example, when the light including the ultraviolet light is used as the energy, a material through which the ultraviolet light passes such as quarts is preferably used.

Figure 7D:
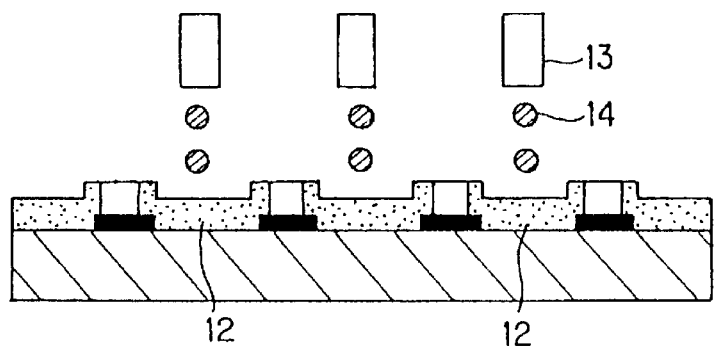

Using an ink jet apparatus 13, an ink 14 is injected into an exposed part for a picture element part 12 thus formed, which was converted into an inkphilic region by the energy irradiation to color the part with red, green and blue (FIG. 7(D)). In this case, since the interior of an exposed part for a picture element part 12 was made into an inkphilic region having the small contact angle with a liquid by the energy irradiation as described above, an ink 14 injected from an ink jet apparatus 13 is spread uniformly in an exposed part for a picture element part 12. In addition, since a region of a photocatalyst-containing layer not exposed was a part of an ink-repellent region, an ink is repelled in this region and removed therefrom.

An ink jet apparatus used in the present invention is not particularly limited but an ink jet apparatus can be used which uses various methods such as a method of injecting a charged ink continuously and controlling with the magnetic field, a method of injecting an ink intermittently using a piezo-element, a method of injecting an ink intermittently by heating the ink and utilizing its bubbling.

Figure 7E:
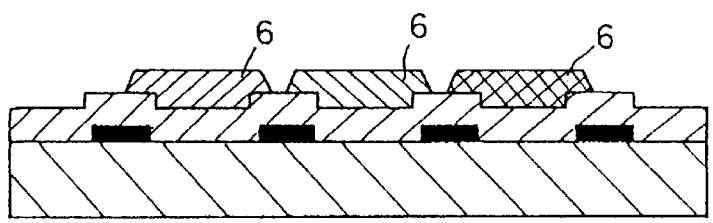

A picture element part 6 is formed by solidifying the ink thus adhered to an exposed part for a picture element part 12 (FIG. 7(E)). In the present invention, the solidification of an ink is carried out by various methods depending upon a kind of an ink used. For example, in the case of a water-soluble ink, the solidification is performed by removing water by heating or the like.

In view of this step of solidifying an ink, as a kind of an ink used in the present invention, an ink is preferably a UV-curing ink. This is because since a UV-curing ink can be rapidly solidified by the UV irradiation, a time for producing a color filer can be shortened.

As described above, since an ink in an exposed part for a picture element part 12 is uniformly spread, when an ink is solidified like this, a picture element part 6 having neither color missing nor color nonuniformity can be formed. And, a protecting layer may be further provided thereon as necessary.

By performing such the each step, a color filter of the first embodiment of the present invention shown in FIG. 1 can be manufactured.

(Ink-Repellent Convex Part)

The sixth embodiment of the present invention may has a step of irradiating a photocatalyst-containing layer on a shading part with the energy pattern irradiation to form an exposed part for an ink-repellent convex part and forming an ink-repellent convex part in this exposed part for an ink-repellent convex part after a step of provision of a photocatalyst-containing layer.

A step of forming this ink-repellent convex part will be explained using FIG. 9. According to the same manner as in the aforementioned sixth embodiment shown in FIG. 7, a shading part 3 is formed on a transparent substrate 2 and a photocatalyst-containing layer 5 is formed so as to cover the above, and thus obtained member is irradiated with the energy via a mask for an ink-repellent convex part 15 (FIG. 9(A)). By pattern-irradiating the energy via a mask for an ink-repellent convex part, an exposed part for an ink-repellent convex part 16 is formed on a photocatalyst-containing layer 5 on a shading part.

Figure 9A:
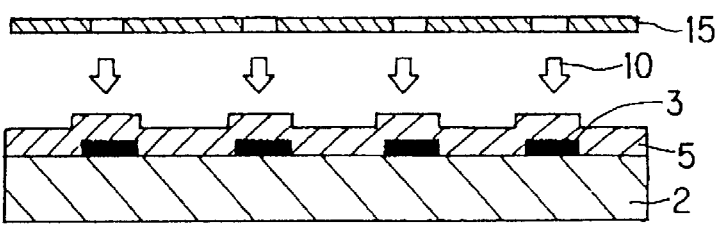
FIG. 9 is a process drawing for explaining a process for producing an ink-repellent convex part in the process for producing a color filter shown in FIG. 7.
Figure 9B:
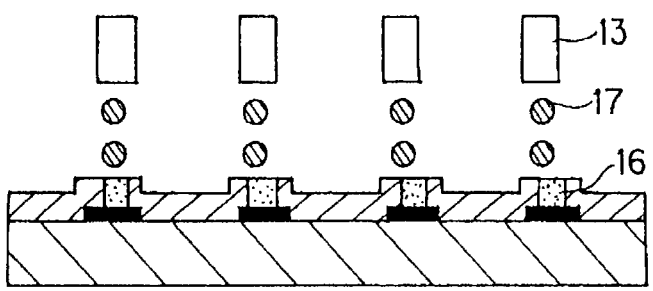

An ink for an ink-repellent convex part 17 such as a UV-curing resin monomer is adhered to this exposed part for an ink-repellent convex part 16 by an ink jet apparatus 13 (FIG. 9(B)). A method of applying this ink for an ink-repellent convex part is not limited to a method by an ink jet apparatus but other methods, for example, dip coating and the like may be used.

Figure 9C:
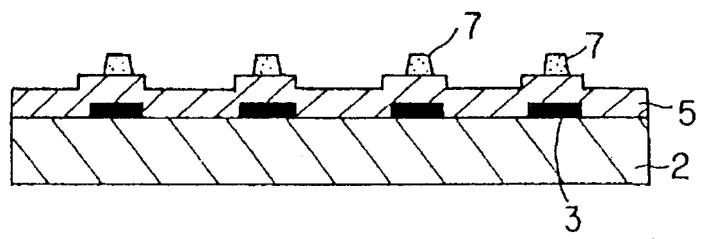

And, by curing an ink for an ink-repellent convex part 17 by UV irradiation or the like, an ink-repellent convex part 7 is formed on the surface of a photocatalyst-containing layer 5 on a shading part 3 (FIG. 9(C)). The width of this ink-repellent convex part 7 is preferably formed narrower than that of a shading part 3 as shown in a figure. This is because such the formation does not lead to a problem such as color missing and the like as described above.

Figure 9D:
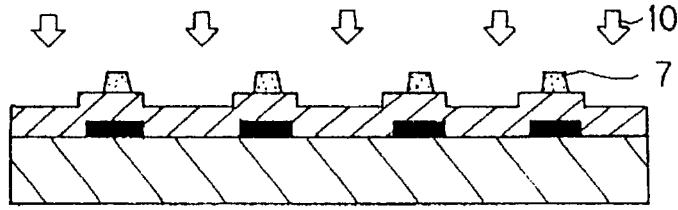
Figure 9E:
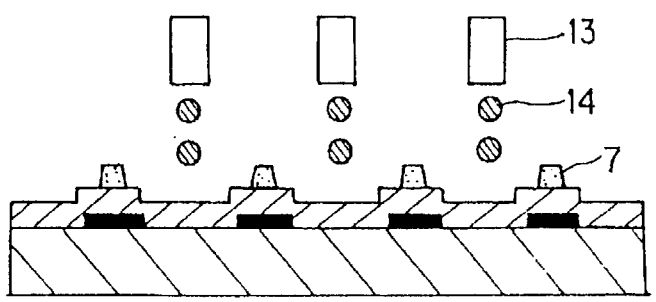
Figure 9F:
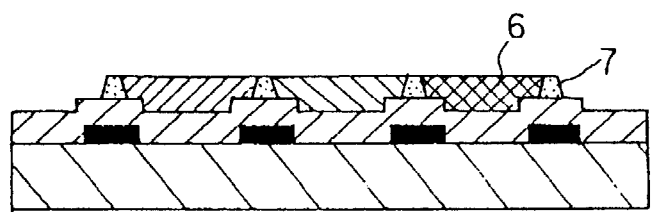

By irradiating the whole surface or pattern-irradiating with the energy 10 from a side of a photocatalyst-containing layer 5, to the thus formed member in which an ink-repellent convex part 7 is formed on a photocatalyst-containing layer 5, a part other than a part on which an ink-repellent convex part 7 is formed, is exposed and made into an exposed part for a picture element part and, thereafter, according to the aforementioned manner, an ink 14 is injected and adhered to this part using an ink jet apparatus 13 and cured to form a picture element part 6 and, thus, a color filter with an ink-repellent convex part 7 provided thereon can be manufactured (FIGS. 9(D), (E), (F)).

In this method, since an exposed part for an ink-repellent convex part is provided by pattern-irradiating a photocatalyst-containing layer on a shading part with the energy, an ink-repellent convex part having an arbitrary width can be formed. Therefore, by applying an ink for an ink-repellent convex part thereon, an ink-repellent convex part having an arbitrary width can be formed. Hence, by adjusting the width of a mask for an ink-repellent convex part 15, an ink-repellent convex part 7 having the narrower width than that of the aforementioned shading part 3 can be formed. By forming such the ink-repellent convex part 7 having the narrower width than that of a shading part 3, since the width of a picture element part 6 formed between the ink-repellent convex parts 7 can be wider than that of an opening of a shading part 3, a color filter having no disadvantages such as color missing and the like can be obtained as described above.

In addition, in this embodiment, an ink-repellent convex part is formed by utilizing the change in the wettability of a photocatalyst-containing layer but the formation is not limited to this in the present invention and, for example, an ink-repellent convex part may be provided by a photolithography or the like.

(A Method of Forming a Picture Element Part)

In the present invention, a picture element part 6 may be formed by one time energy irradiation and adhesion of an ink to an exposed part as in the aforementioned sixth embodiment but, in the sixth embodiment, a distance between exposed parts for a picture element part which are an inkphilic region irradiated with the energy upon adhesion of an ink, is short. Therefore, there is a possibility that a problem such as the ink mixing and the like may occur upon formation of a picture element part. As a method of avoiding such the problem, mention may be made of a method of dividing the energy irradiation and formation of a picture element part into at least two times.

FIG. 10 shows an example in which the energy irradiation and formation of a picture element part were performed by dividing into two times. A shading part 3 is formed on a transparent substrate 2 as in the aforementioned example shown in FIG. 7, a member in which a photocatalyst-containing layer 5 is formed on a transparent substrate 2 so as to cover this shading part 3, is irradiated with the energy 10 using a mask 11' so that a picture element part is formed on every other picture element part forming portion, to obtain an exposed part for a picture element part 12 (FIG. 10(A)). By adhering an ink 14 to this exposed part for a picture element part 12 using an ink jet apparatus 13 (FIG. 10(B)), a picture element part 6 is formed on every other a picture element part forming portion (FIG. 10(C)). It is preferable that a picture element part thus formed itself is ink-repellent in order to prevent second time coloration of an ink to this picture element part by an ink jet apparatus and the surface thereof may be treated with an ink-repellent treating agent such as a silicone compound and a fluorine-containing compound.

Figure 10A:
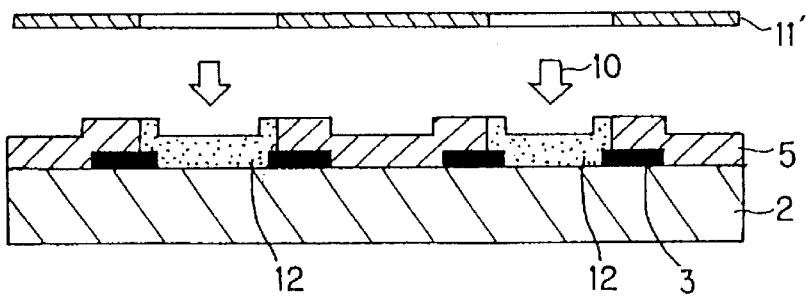
FIG. 10 is a process drawing for explaining an another example of a production of a picture element part in the process for producing a color filter shown in FIG. 7.
Figure 10B:
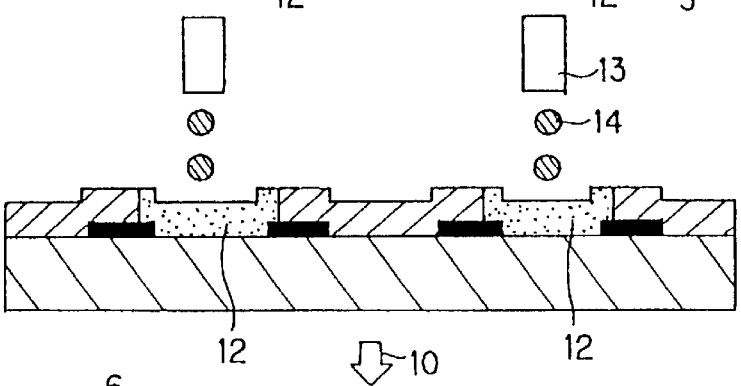
Figure 10C:
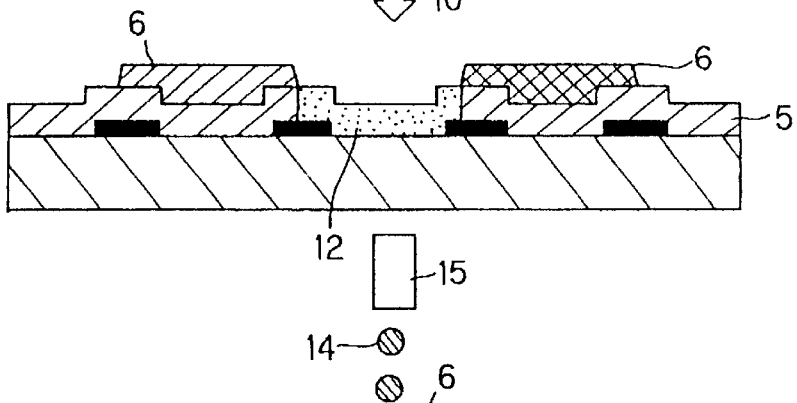
Figure 10D:
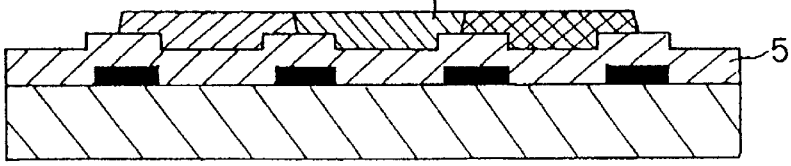

And, by irradiating again with the energy 10 from a photocatalyst-containing layer 5 side on which a picture element part 6 is formed alternately, a picture element part forming portion between picture element parts 6 is exposed to form an exposed part for a picture element part 12 and, by adhering an ink 14 thereon using an ink jet apparatus 15, a color filter can be obtained (FIG. 10(D)).

According to this method, since it is also possible to shorten or eliminate a distance between each picture element part, a colored layer (aggregate of picture element parts) having the excellent flatness can be formed. In addition, a distance between picture element parts upon first time formation of a picture element part is large, inks are not mixed over this part. Therefore, the high quality color filter having no ink mixture and the like can be obtained.

In addition, in the aforementioned method, a picture element part 6 was formed every other one first time, the present invention is not limited thereto but the change may be performed by the shape of a picture element part of a color filter such as zigzag-like or the like so long as the first formed picture element parts are not in the vicinity. In addition, in the aforementioned explanation, a picture element part was formed by dividing into two times but a picture element part may be formed by dividing into three times or more.

(Energy to be Irradiated)

In the present invention, the light including the ultraviolet light may be used as the energy to be irradiated to a photocatalyst-containing layer. As a light source including the ultraviolet light, for example, mention may be made of a mercury lamp, a metal halide lamp, a xenon lamp and the like. The wavelength of the light used for this exposure can be set from a range of not greater than 400 nm, preferably not greater than 380 nm. In addition, an amount of the light to be irradiated upon exposure may be an amount of irradiation necessary for an exposed part to express the inkphilic properties by the action of a photocatalyst.

When pattern-irradiation is necessary upon the energy irradiation, pattern-irradiation can be performed via a photomask using the aforementioned light source. Alternatively, as an another method, there can also be used a method of picture-irradiating in a pattern like state using a laser such as excimer, YAG and the like. However, such the method may lead to a problem that an apparatus is expensive, the handling is difficult and further the continuous output can not be performed.

Therefore, in the present invention, the pattern of an inkphilic region may be formed by adding the photocatalystic reaction initiating energy to a photocatalyst-containing layer, and adding the reaction rate increasing energy to a region which received the photocatalystic reaction initiating energy in a pattern like state. The reasons are as follows. By forming the pattern using such the energy irradiating method, the reaction rate increasing energy such as the infrared laser which is relatively low cost and easily handled, can be used and the aforementioned problem does not occur.

The pattern of an inkphilic region having the changed wettability can be formed by the addition of such the energy based on the following reasons. That is, first, by adding the photocatalystic reaction initiating energy to a region on which the pattern is to be formed, the photocatalystic reaction is initiated on a photocatalyst-containing layer. Then, the reaction rate increasing energy is added in a region which receives the photocatalystic reaction initiating energy. By adding the reaction rate increasing energy like this, a reaction in a photocatalyst-containing layer to which the photocatalystic reaction initiating energy has been already added and in which a reaction has been initiated by the catalytic action of a photocatalyst is rapidly accelerated. Then, by adding the reaction rate increasing energy for the predetermined period, the change of the wettability in the photocatalyst-containing layer is changed into the desired range and, thus, the pattern to which the reaction rate increasing energy has been added can be made into the pattern of an inkphilic region having the changed wettability.

a. Photocatalystic Reaction Initiating Energy

The photocatalystic reaction initiating energy used for this energy irradiating method refers to the energy that a photocatalyst initiates a catalytic reaction for changing the properties of a compound in a photocatalyst-containing layer.

An amount of the photocatalystic reaction irradiating energy to be added is such the degree of an amount that does not cause the rapid change in the wettability in a photocatalyst-containing layer. When an amount of the photocatalystic reaction initiating energy to be added is small, since the sensitivity upon formation of the pattern by adding the reaction rate increasing energy is lowered, being not preferable. On the other hand, when this amount is too large, the degree of the change in the properties in a photocatalyst-containing layer to which the photocatalystic reaction initiating energy has been added becomes too large and the difference between regions to which the reaction rate increasing energy has been added and not added becomes unclear, being not preferable. An amount of the energy to be added is determined by performing a preliminary experiment on an amount of the energy to be added and the change in the wettability in a photocatalyst-containing layer.

The photocatalystic reaction initiating energy in this method is not particularly limited as long as the energy which can initiate the photocatalystic reaction and, inter alia, the light is preferable.

A photocatalyst used in the present invention has the different wavelength of the light, which initiates a catalytic reaction depending upon the band gap thereof. For example, in the case of cadmiun sulfide, the wavelength is 496 nm and, in the case of iron oxide, the wavelength is 593 nm of the visible light and, in the case of titanium oxide, the wavelength is 388 nm of the ultraviolet light. Therefore, the light can be used in the present invention whether the visible light or the ultraviolet light as long as the light. However, in the context that titanium dioxide is suitably used as a photocatalyst because it is effective as a photocatalyst due to the high band gap energy as described above, chemically stable, has no toxicity and easily available, the light is preferably the light containing the ultraviolet light which initiates a catalytic reaction of this titanium oxide. More particularly, it is preferable that the ultraviolet light in a range of not greater than 400 nm, preferably not greater than 380 nm is contained.

As the light source for such the light containing the ultraviolet light, mention may be made of various ultraviolet sources such as a mercury lamp, a metal halide lamp, a xenon lamp, an excimer lamp and the like.

In the present invention, a range to which this photocatalystic reaction initiating energy is to be added may be a part of a photocatalyst-containing layer. For example, by adding this photocatalystic reaction initiating energy in a pattern like state and further adding the reaction rate increasing energy also in a pattern like state, it is possible to form the pattern of an inkphilic region having the changed wettability. However, for the reasons of similification of steps and the like, it is preferable that this photocatalystic reaction initiating energy is added to the whole surface of a region on which the pattern is to be formed. It is preferable that, by adding the reaction rate increasing energy to a region to the whole surface of which the photocatalystic reaction initiating energy has been added in a pattern like state, the pattern of an inkphilic region is formed on a photocatalystic-containing layer.

b. Reaction Rate Increasing Energy

Then, the reaction rate increasing energy used in this method will be explained. The reaction rate increasing energy used in this method refers to the energy for increasing a reaction rate of a reaction changing the wettability of a photocatalyst-containing layer which was initiated by the aforementioned photocatalystic reaction initiating energy. In the present invention, any energy can be used as long as it is the energy having such the action and, inter alia, the heat energy is preferably used.

A method of adding such the heat energy to a photocatalyst-containing layer in a pattern like state is not particularly limited as long as it can form the pattern by the heat on a photocatalyst-containing layer but mention may be made of a method by the infrared laser, a method by a heat-sensitive head and the like. As such the infrared laser, mention may be made of the infrared YAG laser (1064 nm) having the advantages such as the strong directivity and the long irradiation distance, a diode laser (LED; 830 nm, 1064 nm, 1100 nm) having the advantages such as the relatively low cost, a semiconductor laser, a He—Ne laser, a carbonic dioxide gas laser and the like.

In this method, the pattern of an inkphilic region can be formed based on the difference in the reaction rate between a region to which the reaction rate increasing energy has been added and a region to which the reaction rate increasing energy has not been added, by adding the aforementioned photocatalystic reaction initiating energy and activating a photocatalyst to initiate the change in the wettability by the catalytic reaction in a photocatalyst-containing layer, and adding the reaction rate increasing energy to a part having the changed wettability to promote the catalytic reaction of the part.

2. The Seventh Embodiment

The seventh embodiment of the present invention is one of processes for producing a color filter of the aforementioned second embodiment of the present invention, and comprises:

(1) a step of providing on a transparent substrate a photocatalyst-containing layer having the wettability of the energy-irradiated part which changes in a direction of reduction of the contact angle with a liquid, (2) a step of forming an exposed part for a shading part on a shading part forming portion on which a shading part is to be formed by pattern-irradiating with the energy on the transparent substrate, (3) a step of forming a shading part on this exposed part for a shading part, (4) a step of forming an exposed part for a picture element part by irradiating a transparent substrate on which this shading part was provided with the energy, and (5) a step of coloring this exposed part for a picture element part with an ink jet system to form a picture element part.

FIG. 11 is for explaining each step of the seventh embodiment of the present invention. As shown in FIG. 11(A), a photocatalyst-containing layer 5 is first formed on a transparent substrate 2. The formation of this photocatalyst-containing layer 5 can be performed according to the same manner as that of the aforementioned sixth embodiment.

Then, a shading part forming portion of a photocatalyst-containing layer 5 is pattern-irradiated with the energy 10 using a photomask for a shading part 19 to form an exposed part for a shading part 20. This exposed part for a shading part 20 is a part in which the contact angle with a liquid is lowered by the action of a photocatalyst in a photocatalyst-containing layer 5 and forms an inkphilic region (FIG. 11(B)).

This energy 10 is the same as that of the aforementioned sixth embodiment and means not only the ultraviolet light but also other energy.

Figure 11A:
FIG. 11 is a process drawing for explaining the seventh embodiment of the process for producing a color filter according to the present invention.
Figure 11B:
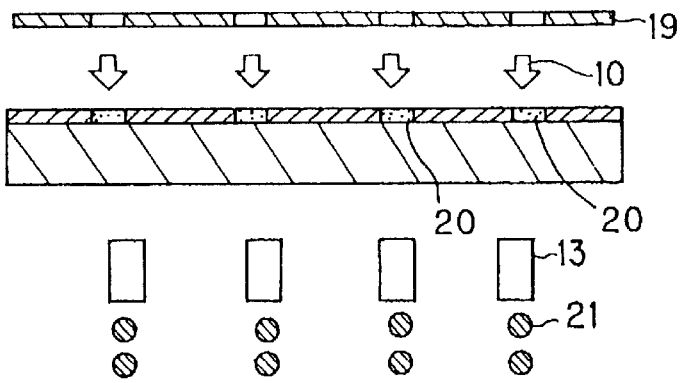
Figure 11C:
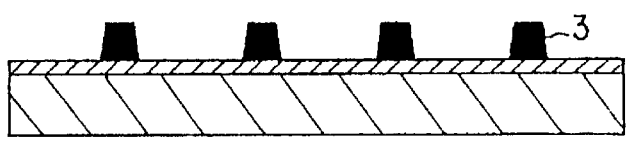
Figure 11D:
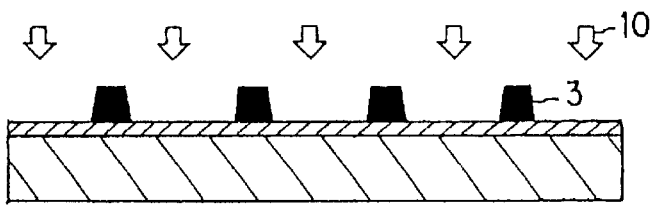

Then, after a coating material for a shading part 21 is adhered to an exposed part for a shading part 20 by an ink jet apparatus 13, the coating material is cured to form a shading part 3 (FIG. 11(C)). Applying of a coating material for a shading part 21 on an exposed part for shading part 20 may be also performed by the known applying method such as spray coating, dip coating, roll coating, bead coating and the like as well as the method using the aforementioned inkjet apparatus. In this case, the applied coating material for a shading part 10 is repelled by an ink-repellent region of a photocatalyst-containing layer 5 having the high contact angle with a liquid, other than an exposed part for a shading part 20, to be removed therefrom, and is selectively adhered to only an exposed part for a shading part 20 which is an inkphilic region having the low contact angle with a liquid.

Further, the formation of a shading part 3 may be performed by a vacuum film forming method. That is, a metal film is formed on the exposed photocatalyst-containing layer 5 by a vacuum metallizing method, which can be patterned by the peeling using an adhesive tape, the solvent treatment or the like utilizing the difference of the adhesive force between a photocatalyst-containing layer 5 other than an exposed part for a shading part 20 and an exposed part for a shading part 20, to form a shading part.

Then, a photocatalyst-containing layer 5 on which a shading part 3 was formed is irradiated with the energy 10 on its whole surface or in a pattern like state. By this, a part on which a shading part 3 is not formed, is made into an exposed part for a picture element part of an inkphilic region by the action of a photocatalyst in a photocatalyst-containing layer 5 (FIG. 1(D)).

Figure 11E:
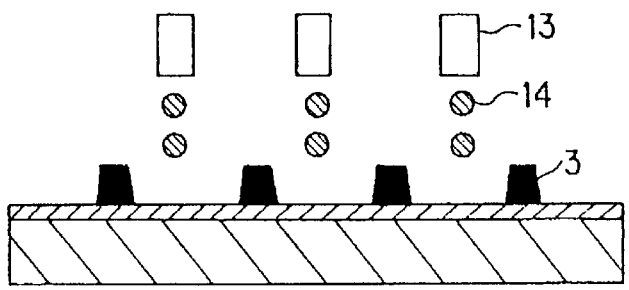

Then, an ink 14 is injected to an exposed part for a picture element part which was made into an inkphilic region by exposure using an ink jet apparatus 13, to color the part with red, green and blue (FIG. 11(E)). In this case, since the interior of an exposed part for a picture element part has become an inkphilic region having the small contact angle with a liquid by the energy irradiation as described above, an ink 14 injected from an ink jet apparatus 13 is uniformly spread in an exposed part for a picture element part.

Figure 11F:
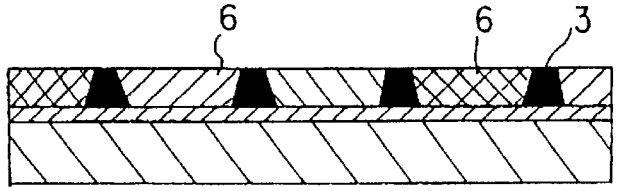

By solidifying an ink thus adhered to an exposed part for a picture element part 11, a picture element part 6 is formed between shading parts 3 (FIG. 11(F)). If necessary, a protecting layer may be further formed.

When a color filter is manufactured by such the process, since an ink in an exposed part for a picture element part 11 is uniformly spread, when an ink 14 is solidified, a picture element part 5 having no color missing, color nonuniformity and the like can be formed and, thus, the high quality color filter can be obtained.

3. The Eighth Embodiment

The eighth embodiment of the present invention is another process for producing a color filter of the aforementioned second embodiment of the present invention, and comprises:

(1) a step of providing on a transparent substrate a photocatalyst-containing layer having the wettability of the energy-irradiated part which changes in a direction of reduction of the contact angle with a liquid;

(2) a step of pattern-irradiating with the energy a picture element part forming portion on the transparent substrate, on which a picture element part is to be formed, to form an exposed part for a picture element part;

(3) a step of coloring this exposed part for a picture element part with an inkjet system to form a picture element part;

(4) a step of irradiating a photocatalyst-containing layer of a border part of at least the picture element part with the energy; and (5) a step of forming a shading part on a border part of the picture element part irradiated with the energy.

Figure 12A:
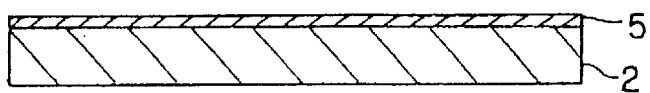
FIG. 12 is a process drawing for explaining the eighth embodiment of the process for producing a color filter according to the present invention.
Figure 12B:
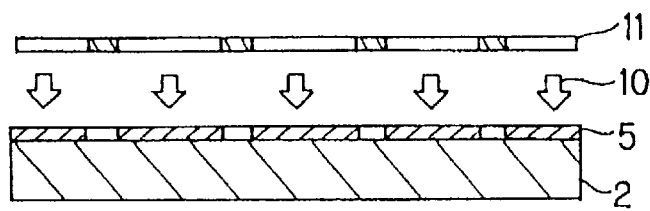
Figure 12C:
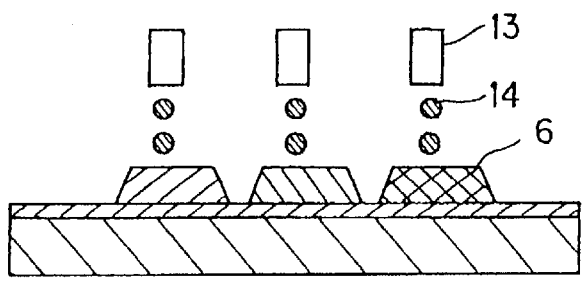

FIG. 12 is for explaining this eighth embodiment and, as in the seventh embodiment, a substrate 2 in which a photocatalyst-containing layer 5 is first formed on its single side is formed (FIG. 12(A)). The energy 10 is pattern-irradiated via a mask 11 from a side of this transparent substrate 2 on which a photocatalyst-containing layer 5 is formed (FIG. 12(B)). An ink 14 is adhered to an exposed part for a picture element part which has become an inkphilic region by the energy irradiation using an ink jet apparatus 13 to form a picture element part 6 (FIG. 12(C)).

Upon formation of this picture element part 6, a method of forming a picture element part by dividing the energy irradiation and the formation of a picture element part into two or more times as explained in the aforementioned sixth embodiment may be used. This is because, upon the formation of a picture element part 6, since an ink-repellent region is narrow between picture element parts 6, there is a possibility that inks may be mixed.

Figure 12D:
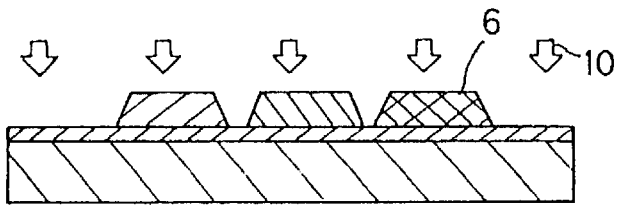
Figure 12E:
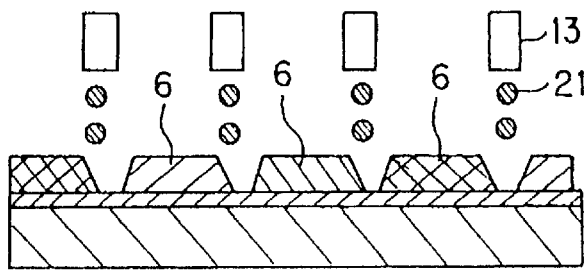
Figure 12F:
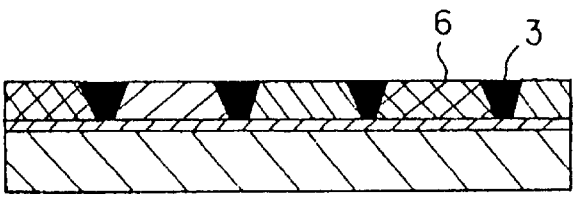

The surface on which a picture element part 6 is thus formed is irradiated with the energy 10 on the whole surface or in a pattern like state, to change an ink-repellent region between picture element parts 6 into an inkphilic region (FIG. 12(D)). Then, a shading part 3 can be formed by adhering a coating solution for a shading part 21 to a border part of this picture element part 6, for example, with an ink jet apparatus 13 and curing the coating material (FIGS. 12(E),(F)). Then, a color filter can be obtained by forming a protecting layer on the surface as necessary.

Since the energy, ink jet apparatus and various inks and the like which are used in the eighth embodiment are similar to those of the aforementioned sixth embodiment, they are not explained here.

4. The Ninth Embodiment

The ninth embodiment of the present invention is a process for producing a color filter which is the third embodiment of the present invention, and comprises:

(1) step of forming a photocatalyst-containing layer having the wettability of the energy-irradiated part on a transparent substrate, which changes in a direction of reduction of the contact angle with liquid, on a picture element part forming portion which is a part on the transparent substrate on which a picture element part is to be formed;

(2) a step of providing a shading part on a border part of the picture element part forming portion provided on the photocatalyst-containing layer;

(3) a step of irradiating the photocatalyst-containing layer with the energy to form an exposed part for a picture element part; and (4) a step of coloring this exposed part for a picture element part with an ink jet system to form a picture element part.

This process is explained using FIG. 4. A photocatalyst-containing layer 5 is first formed on a part on a transparent substrate 2, on which a picture element part is to be formed. That is, according to this method, a photocatalyst-containing layer 5 is first formed on a transparent substrate in a pattern like state. As a method of forming a photocatalyst-containing layer in a pattern like state, for example, mention may be made of a method forming the layer by a photolithography using a photosensitive sol-gel solution, a method by printing and the like.

A shading part 3 is formed on a part (shading part forming portion) on which a photocatalyst-containing layer 5 is not formed, on a transparent substrate 2 on which the thus formed photocatalyst-containing layer 5 is formed, with a coating material for a shading part or the like, for example, using an ink jet system. Upon this, the wettability of the surface of a transparent substrate 2 has been made into more inkphilic as compared with the wettability of a surface on a photocatalyst-containing layer 5. Therefore, upon formation of a shading part 3, a coating material for a shading part is not adhered to a photocatalyst-containing layer showing the ink-repellent properties and is adhered to only a shading part forming portion on a transparent substrate 2, to form a shading part.

In this embodiment, it is preferable that the wettability on a transparent substrate 2 is inkphilic. More particularly, it is preferable that the wettability is less than 10 degrees as the contact angle with a liquid having the surface tension of 40 mN/m, more preferably less than 5 degrees as the contact angle with a liquid having the surface tension of 40 mN/m, particularly preferably less than 1 degree.

After a shading part 3 is formed like this, a photocatalyst-containing layer 5 is irradiated with the energy to make the part into an inkphilic region. A color filter can be formed by forming a picture element part 6 on a photocatalyst-containing layer which was made into an inkphilic region using an ink jet apparatus or the like and, as necessary, further forming a protecting layer.

Also in this embodiment, since the energy to be irradiated, ink jet apparatus and various inks are similar to those of the embodiments as previously explained, the explanation thereof is omitted.

5. The Tenth Embodiment

The tenth embodiment of the present invention is a process for producing a color filter which is the aforementioned fourth embodiment of the present invention, and comprises:

(1) a step of forming a shading part on a transparent substrate;

(2) a step of providing, on this shading part, a photocatalyst-containing layer having the wettability of the energy-irradiated part which changes in a direction of reduction of the contact angle with a liquid; and (3) a step of coloring a picture element part forming portion, on a transparent substrate on which the photocatalyst-containing layer is not formed, on which a picture element part is to be formed, with an ink jet system to form a picture element part.

This process is explained using FIG. 13. A shading part 3 is first formed on a transparent substrate 2 (FIG. 13(A)). Then, a photocatalyst-containing layer 5 is formed in a pattern like state on this shading part 3 (FIG. 13(B)). Here, since a method of forming a shading part 3 and that for forming a photocatalyst-containing layer 5 are similar to those of the aforementioned embodiments, the explanation thereof is omitted.

Here, it is preferable that the width of this photocatalyst-containing layer 5 is formed narrower than that of a shading part 3 in this embodiment. The reasons are as follows. By forming the width of a photocatalyst-containing layer 5 narrower than that of a shading part 3, the width of a picture element part formed between photocatalyst-containing layers 5 at the later step becomes wider than that of an opening formed by this shading part 3 and, therefore, and a problem such as color missing and the like hardly occur as described above.

Figure 13A:
FIG. 13 is a process drawing for explaining the tenth embodiment of the process for producing a color filter according to the present invention.
Figure 13B:
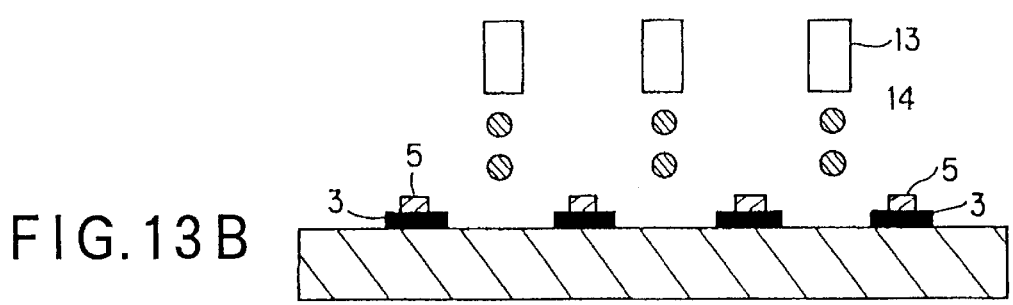
Figure 13C:
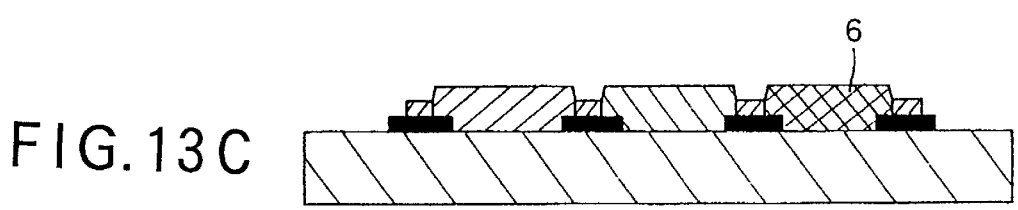

And, by adhering an ink 14 between the photocatalyst-containing layers using an ink jet apparatus 13, a picture element part 6 is formed (FIG. 13(C)). Upon this, since an ink 14 is adhered directly on a transparent substrate 2, it is preferable that a transparent substrate 2 is an inkphilic region on the surface thereof and, more particularly, it is preferable that the contact angle with a liquid having the surface tension of 40 mN/m is less than 10 degrees, more preferably the contact angle with a liquid having the surface tension of 40 mN/m is not more than 5 degrees, particularly preferably not more than 1 degree. This is because, by making a surface of a transparent substrate 2 into an inkphilic region, an ink 14 is uniformly spread over a transparent substrate and disadvantages such as color nonuniformity and the like do not occur.

Figure 13D:
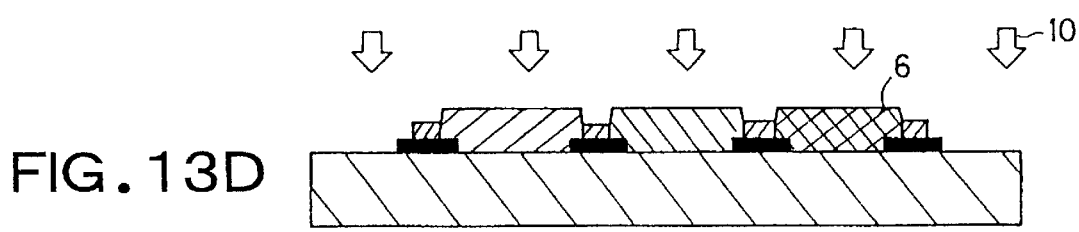
Figure 13E:
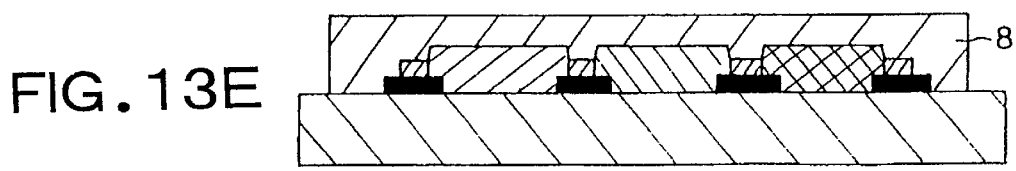

By irradiating a surface on which a picture element part 6 is formed with the energy after formation of the picture element part 6 (FIG. 13(D)), the formation of a protecting layer 8 which is provided as necessary becomes easy (FIG. 13(E)).

Also in this embodiment, since the energy to be irradiated, ink jet apparatus and various inks are similar to those of the aforementioned embodiments, the explanation thereof is omitted.

6. The Eleventh Embodiment

The eleventh embodiment of the present invention is a process for producing a color filter which is the fifth embodiment of the present invention, and comprises:

(1) a step of providing a photocatalyst-containing layer having the wettability of the energy-irradiated part on a transparent substrate, which changes in a direction of reduction of the contact angle with a liquid, on a shading part forming portion on which a shading part is to be formed on a transparent substrate;

(2) a step of coloring a part on the transparent substrate on which a photocatalyst-containing layer is not formed with an ink jet system, to form a picture element part;

(3) a step of irradiating at least the aforementioned photocatalyst-containing layer with the energy; and (4) a step of forming a shading part on a photocatalyst-containing layer irradiated with the energy.

This process is explained using FIG. 6. a photocatalyst-containing layer 5 is first formed on a transparent substrate 2 in a pattern like state. A method of forming this photocatalyst-containing layer 5 in a pattern like state can be performed by a method used in the aforementioned ninth embodiment. A position of this photocatalyst-containing layer to be formed is a shading part forming portion 9 on which a shading part 3 is to be formed. Then, an ink is adhered to a part on which a photocatalyst-containing layer 5 is not formed, that is, a picture element part forming portion on which a picture element part is to be formed, using an ink jet apparatus or the like, to form a picture element part 6. Upon this, for the similar reasons to those of the aforementioned tenth embodiment, the wettability on a transparent substrate is preferably an inkphilic region. More particularly, it is preferable that the contact angle with a liquid having the surface tension of 40 mN/m is less than 10 degrees, more preferably the contact angle with a liquid having the surface tension of 40 mN/m is not more than 5 degrees, particularly preferably not more than 1 degree.

And, after a photocatalyst-containing layer 5 is made into inkphilic by irradiation with the energy, a shading part 3 is formed on this photocatalyst-containing layer 5. Then, finally, a protecting layer 8 is formed as necessary.

In this embodiment, regarding the energy to be irradiated, an ink jet apparatus to be used and various inks, the aforementioned ones explained on other embodiments can be used.

C. Color Liquid Crystal Panel

A color liquid crystal panel can be formed by combining the thus obtained color filter and an opposite substrate which is opposite to this color filter, and encapsulating a liquid crystal compound therebetween. The thus obtained color liquid crystal panel has the advantages originated from the color filter of the present invention, that is, advantages that color nonuniformity and color missing do not occur, and it is advantageous in a respect of cost.

The present invention is not limited to the aforementioned embodiments. The aforementioned embodiments are merely illustrative and whatsoever has the substantially same construction as that described in claims and exerts the same action and effects are included in the present invention.

EXAMPLES

The present invention is explained in detail by means of the following examples.

Example 1

1. Formation of Photocatalyst-Containing Layer 30 g of isopropylalcohol, 0.4 g of MF-160E (manufactured by Tohchem Products Co.), a main component of which is fluoroalkylsilane, 3 g of trimethoxymethylsilane (manufactured by Toshiba Silicone Co., Ltd., TSL8113) and 20 g of a dispersion of titanium oxide which is photocatalyst in water ST-K01 (manufactured by Ishihara Sangyo Kaisha, Ltd.) were mixed and stirred at 100° C. for 20 minutes. This was diluted three-times with isopropylalcohol to obtain a composition for a photocatalyst-containing layer.

The composition was applied on a glass transparent substrate with a spin coater and dried at 50° C. for 10 minutes to form a transparent photocatalyst-containing layer (thickness 0.2 $\mu$m).

2. Confirmation of Formation of an Inkphilic Region by Exposure

The pattern-exposure was performed for 50 seconds on this photocatalyst-containing layer at an illuminance of 70 mW/cm$^2$ with a mercury lamp (wavelength 365 nm) via a mask, an exposed part was formed and the contact angles with a liquid of an unexposed part and an exposed part were measured. At unexposed part, the contact angle with a liquid having the surface tension of 30 mN/m (manufactured by Junsei Chemical Co., Ltd., ethylene glycol monoethyl ether) was measured (after 30 seconds from dropping of a droplet from a microsyringe) of using a contact angle measuring apparatus (manufactured by Kyowa Interface Science Co., Ltd., type CA-Z) and found to be 30 degrees. As an exposed part, the contact angle with a liquid having the surface tension of 50 mN/m (manufactured by Junsei Chemical Co., Ltd., wettability index standard solution No. 50) was measured in a similar method and found to be 7 degrees. Like this, an exposed part was converted into an inkphilic region and it was confirmed that the pattern formation is possible due to the difference in the wettability between an exposed part and an unexposed part.

3. Formation of Shading Part

Then, a photocatalyst-containing layer was formed on a transparent substrate according to the same manner as that described above. This photocatalyst-containing layer was exposed (at an illuminance of 70 mW/cm$^2$ for 50 seconds) with a mercury lamp (wavelength 365 nm) via a mask for a shading part on which an opening pattern(opening line width 30 $\mu$m) is provided in the matrix-like, convert an exposed part for a shading part into an inkphilic region (not greater than 7 degrees in terms of the contact angle with a liquid having the surface tension of 50 mN/m).

On the other hand, a mixture having the following composition was heated to 90° C. to dissolve, centrifuged at 12000 rpm and, thereafter, filtered with a 1 $\mu$m glass filter. To the resulting aqueous colored resin solution was added 1% by weight of ammonium dichromate as a cross-linking agent to prepare a coating material for a shading part.

Carbon black (manufactured by Mitsubishi Chemical Corporation, # 950) . . . 4% by weight Polyvinyl alcohol (manufactured by Nippon Synthetic Chemicals Co., Ltd., Gosenol AH-26) . . . 0.7% by weight Ion exchanged water . . . 95.3% by weight Then, the aforementioned coating material for a shading part was applied on the whole surface of a photocatalyst-containing layer with a blade coater. The thus applied coating material for a shading part was repelled from an unexposed part of a photocatalyst-containing layer and it was selectively adhered to only an exposed part for a shading part. Thereafter, drying was performed at 60° C. for 3 minutes and exposure was performed with a mercury lamp to cure a coating material for a shading part, which was further heat-treated at 150° C. for 30 minutes to form a shading part.

4. Formation of Picture Element Part

Then, the whole surface of a photocatalyst-containing layer on which a shading part is formed is exposed to convert a picture element part forming portion into an inkphilic. Then, a UV-curing type multifunctional acrylate monomer ink of each RGB color containing 5% by weight of a pigment, 20% by weight of a solvent, 5% by weight of an initiator and 70% by weight of a UV-curing resin was adhered to an exposed part of a picture element part which was converted into inkphilic to color it using an ink jet apparatus, and UV-treated to cure it. Here, as regards each of red, green and blue ink, as a solvent, polyethylene glycol monometylethyl acetate was used and, as an initiator, Ilgacular 369 (trade name, manufactured by Chiba Speciality Chemicals Co., Ltd.) was used and, as a UV-curing resin, DPHA (dipentaerythritol hexaacrylate, manufactured by Nippon Kayaku Co., Ltd.) was used. In addition, regarding a pigment, as a red ink, C.I. Pigment Red 177 was used and, as a green ink, C. I. Pigment Green 36 was used and, as a blue ink, C. I. Pigment Blue 15+C. I. Pigment Violet 23 was used.

5. Formation of a Protecting Layer

A protecting layer was formed by applying a two-pack mixing type thermally curing agent (SS7265 manufactured by Nippon Synthetic Rubber Co., Ltd.) with a spin coater and curing-treated at 200° C. for 30 minutes to obtain a color filter. The resulting color filter was of the high quality free from color missing or color nonuniformity at a picture element part.

Example 2

1. Formation of a Photocatalyst-Containing Layer

According to the similar manner to that in Example 1, the similar photocatalyst-containing layer was formed on a transparent substrate on which a shading part was formed with chromium by a sputtering method.

2. Formation of a Picture Element Part

Then, an exposed part for a picture element part was pattern-exposed from a photocatalyst-containing layer side by a mercury lamp (wavelength 365 nm, 70 mW/cm$^2$) for 50 seconds via a mask for a picture element part to convert into an inkphilic region (not more than 7 degrees in terms of a contact angle with a liquid having the surface tension of 50 mN/m).

A UV-curing type multifunctional acrylate monomer ink of each RGB color containing 5% by weight of a pigment, 20% by weight of a solvent, 5% by weight of an initiator and 70% by weight of a UV-curing resin was adhered to this exposed part of a picture element part which was converted into inkphilic to color it using an ink jet apparatus and UV-treated to cure it. Here, as regards each of red, green and blue ink, as a solvent, polyethylene glycol monometylethyl acetate was used and, as an initiator, Ilgacular 369 (trade name, manufactured by Chiba Speciality Chemicals Co., Ltd.) was used and, as a UV-curing resin, DPHA (dipentaerhythritol hexaacrylate, manufactured by Nippon Kayaku Co., Ltd.) was used. In addition, regarding a pigment, as a red ink, C.I. Pigment Red 177 was used and, as a green ink, C. I. Pigment Green 36 was used and, as a blue ink, C. I. Pigment Blue 15+C. I. Pigment Violet 23 was used.

3. Formation of a Protecting Layer

A protecting layer was formed by applying a two-pack mixing type thermally curing agent (SS7265 manufactured by Nippon Synthetic Rubber, Ltd.) with a spin coater and curing-treated at 200° C. for 30 minutes to obtain a color filter. The resulting color filter was of the high quality free from color missing or color nonuniformity of a picture element part as in Example 1.

Example 3

1. Formation of a Photocatalyst-Containing Layer 3 g of isopropylalcohol, 0.014 g of fluoroalkylsilane (manufactured by Tohchem Products Co.; MF-160E (trade name), a 50% by weight solution of isopropyl ether of N-[3-(trimethoxysilyl)propyl]-N-ethylperfluorooctabesulfonamide), 2 g of a titanium oxide sol (manufactured by Ishihara Sangyo Kaisha, Ltd.; STS-01 (trade name)), 0.6 g of a silica sol (manufactured by Nippon synthetic Rubber, Ltd.; Glaska HPC7002 (trade name)) and 0.2 g of alkylalkoxysilane (manufactured by Nippon synthetic Rubber, Ltd.; HPC402II (trade name)) were mixed and stirred at 100° C. for 20 minutes. This solution was applied on a non-alkali glass substrate having the thickness of 0.7 mm by a spin coating method to obtain a photocatalyst-containing layer having the thickness of 0.15 μm.

2. Confirmation of Formation of an Inkphilic Region by Exposure and Reduction of an Amount of Fluorine The surface of this photocatalyst-containing layer was irradiated with the ultraviolet light for 2 minutes at an illuminance of 70 mW/cm$^2$ (365 nm) by a super high pressure mercury lamp via a lattice-like photomask, and a contact angle with n-octane (surface tension of 21 mN/m) was measured with a contact angle measuring apparatus (manufactured by Kyowa Interface Science Co., Ltd., type CA-Z) and found to be 52 degrees at an unexposed part and 0 degrees at an exposed part.

An unexposed part and an exposed part were elementally-analyzed with a X-ray photoelectron spectroscopy apparatus (V.G. Scientific Co., Ltd., ESCLAB220-I-XL). The quantitative calculation was performed with the Sherry correction and Scofield relative sensitivity correction to obtain the results which were expressed as a relative value of weight relative to 100 of titanium (Ti) and found to be fluorine (F) 1279 relative to titanium (Ti) 100 at an unexposed part and fluorine (F) 6 relative to titanium (Ti) 100 at an exposed part.

From these results, it was found that, by exposing a photocatalyst-containing layer, a ratio of fluorine in the surface of a photocatalyst-containing layer is reduced and, thereby, the surface is converted from ink-repellent into inkphilic.

What is claimed is:

1. A process for producing a color filter, which comprises:
    (1) a step of forming a shading part on a transparent substrate;
    (2) a step of providing a photocatalyst-containing layer having a wettability of an energy-irradiated part which changes in a direction of reduction of a contact angle with a liquid, on a surface of the transparent substrate, on which the shading part is formed;
    (3) a step of irradiating with an energy a picture element part forming portion which is a part on the photocatalyst-containing, layer on which a picture element part is to be formed, to form an exposed part for a picture element part; and
    (4) a step of coloring the exposed part for a picture element part with an ink jet system to form a picture element part.

2. The process for producing a color filter according to claim 1, which comprises a step of pattern-irradiating the photocatalyst-containing layer on the shading part with the energy to form an exposed part for an ink-repellent convex part and forming an ink-repellent convex part on the exposed part for an ink-repellent convex part after the step of providing the photocatalyst-containing layer.

3. The process for producing a color filter according to claim 1, wherein the exposed part for a picture element part is formed by exposing from a transparent substrate side using the shading part as a mask in the step of forming the exposed part for a picture element part.

4. The process for producing a color filter according to claim 1, the step of, after formation of the exposed part for a picture element part, coloring the part with an ink jet system to form a picture element part comprises:

- (a) a step of pattern-irradiating with the energy a portion of a part on the photocatalyst-containing layer on which the picture element part is to be formed, to form a first exposed part for a picture element part;
- (b) a step of coloring the first exposed part for a picture element part with the ink jet system to form the first picture element part;
- (c) a step of exposing a remaining part on the photocatalyst-containing layer on which a picture element part is to be formed, to form a second exposed part for a picture element part; and
- (d) a step of coloring the second exposed part for a picture element part with the inkjet system, to form the second picture element part.

5. The process for producing a color filter according to claim 1, wherein the width of the picture element part is formed wider than that of an opening formed by the shading part.

6. The process for producing a color filter according to claim 1, wherein the energy to be irradiated to the photocatalyst-containing layer is a light containing an ultraviolet light.

7. The process for producing a color filter according to claim 1, wherein the energy to be irradiated to the photocatalyst-containing layer is the photocatalystic reaction initiating energy and the reaction rate increasing energy and an exposed part is formed by irradiating with the reaction rate increasing energy a part irradiated with the photocatalystic reaction initiating energy.

8. The process for producing a color filter according to claim 7, wherein the photocatalystic reaction initiating energy is a light containing an ultraviolet ray and the reaction rate increasing energy is a heat energy.

9. The process for producing a color filter according to claim 8, wherein the heat energy is added by an infrared laser.

10. The process for producing a color filter according to claim 1, wherein the contact angle on the photocatalyst-containing layer with a liquid having a surface tension of 40 mN/m is 10 degrees or more at a part not irradiated with the energy and less than 10 degrees at a part irradiated with the energy.

11. The process for producing a color filter according to claim 1, wherein a coloring of the exposed part for a picture element part with the ink jet system is the coloring with the ink jet system using a UV-curing ink.

12. A process for producing a color filter, which comprises:

- (1) a step of forming a photocatalyst-containing layer having a wettability of an energy-irradiated part which changes in a direction of reduction of a contact angle with a liquid, on a transparent substrate;
- (2) a step of pattern-irradiating a shading part forming portion which is a part on the transparent substrate on which a shading part is to be formed, with an energy to form an exposed part for a shading part;
- (3) a step of the shading part on the exposed part for a shading part;
- (4) a step of irradiating a transparent substrate on which the shading part is provided with the energy to form an exposed part for a picture element part; and
- (5) step of coloring the exposed part for a picture element part with an ink jet system to form a picture element part.

13. A process for producing a color filter, which comprises:

- (1) a step of providing a photocatalyst-containing layer having a wettability of an energy-irradiated part which changes in a direction of reduction of a contact angle with a liquid, on a transparent substrate;
- (2) a step of pattern-irradiating with an energy a picture element part forming portion on the transparent substrate, on which a picture element part is to be formed, to form an exposed part for a picture element part;
- (3) a step of coloring the exposed part for a picture element part to form the picture element part using an inkjet system;
- (4) a step of irradiating the photocatalyst-containing layer which is at least a border part of the picture element part with the energy; and
- (5) a step of forming a shading part on the border part of the picture element part irradiated with the energy.

14. A process for producing a color filter, which comprises:

- (1) a step of providing a photocatalyst-containing layer having a wettability of an energy-irradiated part which changes in a direction of reduction of a contact angle with a liquid, on a picture element part forming portion on a transparent substrate on which a picture element part is to be formed;
- (2) a step of providing a shading part on a border part of the picture element part forming portion in which the photocatalyst-containing layer is provided;
- (3) a step of irradiating the photocatalyst-containing layer with an energy to form an exposed part for a picture element part; and
- (4) a step of coloring the exposed part for a picture element part to form the picture element part using an inkjet system.

15. The process for producing a color filter according to claim 14, wherein the wettability on the transparent substrate is less than 10 degrees as a contact angle with a liquid having a surface tension of 40 mN/m.

16. A process for producing a color filter, which comprises:

- (1) a step of forming a shading part on a transparent substrate;
- (2) a step of providing a photocatalyst-containing layer having a wettability of an energy-irradiated part which changes in a direction of reduction of a contact angle with a liquid, on the shading part; and
- (3) a step of coloring with an ink jet system a picture element part forming portion, which is a part in which a picture element part is to be formed, on a transparent substrate on which the photocatalyst-containing layer is not provided, to form the picture element part.

17. A process for producing a color filter, which comprises:
- (1) a step of providing a photocatalyst-containing layer having a wettability of an energy-irradiated part which changes in a direction of reduction of a contact angle with a liquid, on a shading part forming portion on a transparent substrate on which a shading part is to be formed;
- (2) a step of coloring a part on the transparent substrate with an ink jet system, on which a photocatalyst-containing layer is not formed;
- (3) a step of irradiating an energy at least the photocatalyst-containing layer; and
- (4) a step of forming a shading part on the photocatalyst-containing layer irradiated with the energy.

* * * * *